(12) United States Patent
Lee et al.

(10) Patent No.: US 11,925,084 B2
(45) Date of Patent: *Mar. 5, 2024

(54) DISPLAY PANEL AND REPAIR METHOD THEREOF

(71) Applicant: LG Display Co., Ltd., Seoul (KR)

(72) Inventors: Dong Yoon Lee, Paju-si (KR); Kwang Yong Choi, Paju-si (KR); Seong Hwan Hwang, Paju-si (KR); Byeong Uk Gang, Paju-si (KR); Hye Min Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/083,213

(22) Filed: Dec. 16, 2022

(65) Prior Publication Data

US 2023/0120823 A1    Apr. 20, 2023

Related U.S. Application Data

(63) Continuation of application No. 17/113,743, filed on Dec. 7, 2020, now Pat. No. 11,557,642.

(30) Foreign Application Priority Data

Dec. 30, 2019 (KR) .................. 10-2019-0178609
Sep. 8, 2020 (KR) .................. 10-2020-0114773

(51) Int. Cl.
*H10K 59/131* (2023.01)
*H10K 71/00* (2023.01)

(52) U.S. Cl.
CPC .......... *H10K 59/131* (2023.02); *H10K 71/00* (2023.02); *H10K 71/861* (2023.02)

(58) Field of Classification Search
None
See application file for complete search history.

(56) References Cited

U.S. PATENT DOCUMENTS 11,557,642 B2 * 1/2023 Lee .................. H10K 71/00
2007/0102707 A1 5/2007 Lee et al.
(Continued)

FOREIGN PATENT DOCUMENTS

CN    1523413 A    8/2004
CN    104183621 A    12/2014
(Continued)

OTHER PUBLICATIONS

Anonymous, "Metallizations—an overview", ScienceDirect Topics, Jan. 15, 2016, pp. 1-16, XP055806045 URL:https://www.sciencedirect.com/topics/engineering/metallizations.
(Continued)

*Primary Examiner* — J. E. Schoenholtz
(74) *Attorney, Agent, or Firm* — Birch, Stewart, Kolasch & Birch, LLP

(57) ABSTRACT

A display panel can include a substrate, a light-emitting element including an emission region on the substrate, a reference voltage line adjacent to the light-emitting element, and a branch line connected to the reference voltage line to apply a reference voltage to light-emitting element. The light-emitting element can emit light on the emission region in a direction of the substrate. Further, the branch line can include a semiconductor layer, and the semiconductor layer of the branch line can overlap the emission region.

20 Claims, 21 Drawing Sheets

(56) References Cited

U.S. PATENT DOCUMENTS

| | | | |
|---|---|---|---|
| 2014/0346475 A1 | 11/2014 | Cho et al. | |
| 2015/0137099 A1 | 5/2015 | Choi | |
| 2015/0302828 A1 | 10/2015 | Chaji et al. | |
| 2016/0164050 A1* | 6/2016 | Choi | H10K 59/126 438/23 |
| 2017/0317155 A1 | 11/2017 | Oh et al. | |
| 2017/0329189 A1 | 11/2017 | Kim et al. | |
| 2018/0190751 A1* | 7/2018 | Lee | H10K 59/131 |
| 2018/0323251 A1* | 11/2018 | Gang | H10K 59/126 |
| 2019/0355802 A1* | 11/2019 | Shim | H10K 59/121 |
| 2021/0036029 A1* | 2/2021 | Park | H01L 27/127 |
| 2021/0091161 A1* | 3/2021 | Baek | H10K 59/124 |
| 2021/0134899 A1* | 5/2021 | Peng | H10K 59/127 |
| 2021/0408160 A1* | 12/2021 | Yuan | H10K 59/1213 |

FOREIGN PATENT DOCUMENTS

| | | |
|---|---|---|
| CN | 107664862 A | 2/2018 |
| CN | 108022946 A | 5/2018 |
| CN | 110114885 A | 8/2019 |
| CN | 110503918 A | 11/2019 |
| JP | 2010-32642 A | 2/2010 |
| JP | 2012-68629 A | 4/2012 |
| JP | 2017-198809 A | 11/2017 |
| JP | 2018-72813 A | 5/2018 |
| JP | 2019-186384 A | 10/2019 |
| JP | 2019-194712 A | 11/2019 |
| KR | 10-2007-0049740 A | 5/2007 |
| KR | 10-2015-0034047 A | 4/2015 |
| KR | 10-2018-0003707 A | 1/2018 |

OTHER PUBLICATIONS

Singh, et al. "Desing of a Threshold Voltage Insensitive 3T1C Pixel Circuit Usinig a-IGZO TFT for AMOLED Displays", 10.1109/VDAT50263.2020.9190545, 2020.

* cited by examiner

DISPLAY PANEL AND REPAIR METHOD THEREOF

CROSS-REFERENCE TO RELATED APPLICATION

This application is a Continuation of U.S. patent application Ser. No. 17/113,743 filed on Dec. 7, 2020 (now U.S. Pat. No. 11,557,642, issued on Jan. 17, 2023), which claims priority under 35 U.S.C. § 119 to Korean Patent Application No. 10-2019-0178609 filed on Dec. 30, 2019 and Korean Patent Application No. 10-2020-0114773 filed on Sep. 8, 2020, the entire contents of all these applications are incorporated by reference into the present application.

BACKGROUND

Field

The present disclosure relates to a display device, and more particularly, to a display panel for a display device, and a repair method thereof.

Discussion of Related Art

In most electronic devices, liquid crystal displays (LCDs), organic-light emitting displays, and the like are applied as display devices. The organic light-emitting display in an active matrix type reproduces an image using a light-emitting element such as an organic light-emitting diode (OLED). Such an organic light-emitting display can have a high response speed, a high luminous efficiency, a high luminance, and a wide viewing angle and can express a black gradation in complete black and, thus, can have a high contrast ratio and color reproduction ratio. In addition, the organic light-emitting display is advantageous in implementing a flexible display device because components can be formed on a flexible substrate such as a plastic substrate.

Although research is being conducted on various methods of increasing the aperture ratio in accordance with a high resolution of an organic light-emitting display device, a design for increasing the aperture ratio is difficult due to a pixel circuit and lines connected to the pixel circuit.

SUMMARY OF THE DISCLOSURE

The present disclosure is directed to satisfying the above-described needs and/or addressing the above-described problems and limitations associated with the related art.

In particular, the present disclosure is directed to providing a display panel in which an aperture ratio of pixels is increased. The present disclosure is directed to providing a repair method of darkening a defective pixel of the display panel.

The objects of the present disclosure are not limited to the objects described above, and other objects not described above will be obvious to persons having an ordinary knowledge in this field from the following descriptions.

According to an aspect of the present disclosure, there is provided a display panel including a plurality of pixel circuits in which an emission region, through which light from a light-emitting element is emitted, is defined, a power line configured to apply a pixel driving voltage to the pixel circuits, a reference voltage line to which a reference voltage lower than the pixel driving voltage is applied, and a branch line connected to the reference voltage line to apply the reference voltage to one or more of the pixel circuits. At least a portion of the branch line includes a metalized semiconductor layer.

According to another aspect of the present disclosure, there is provided a display panel including a plurality of pixel circuits each including a driving element configured to drive a light-emitting element, a light-shield metal layer disposed below the driving element, and a capacitor connected to a gate electrode of the driving element; a power line configured to apply a pixel driving voltage to the pixel circuits; a reference voltage line to which a reference voltage lower than the pixel driving voltage is applied; and a branch line connected to the reference voltage line to apply the reference voltage to one or more of the pixel circuits, wherein a cross-sectional structure of the pixel circuits includes a first metal layer, a buffer layer configured to cover the first metal layer, an insulating layer formed on the buffer layer to cover a semiconductor layer of the driving element, and a second metal layer formed on the insulating layer, the first metal layer includes the light-shield metal layer below the driving element and a lower electrode of the capacitor, the second metal layer includes the gate electrode, a source electrode, and a drain electrode of the driving element, the semiconductor layer includes an active layer forming a channel of the driving element, and at least a portion of the branch line includes a metalized semiconductor layer disposed coplanar with the semiconductor layer.

According to another aspect of the present disclosure, there is provided a repair method of a display panel including a power line configured to apply a pixel driving voltage to a plurality of pixel circuits, a reference voltage line to which a reference voltage lower than the pixel driving voltage is applied, and a branch line connected to the reference voltage line to apply the reference voltage to one or more of the pixel circuits, the repair method comprising irradiating a laser beam without changing a wavelength of the laser beam to disconnect a branch line and an anode of a light-emitting element, wherein at least a portion of the branch line includes a metalized semiconductor layer.

DETAILED DESCRIPTION OF THE EMBODIMENTS

Figure 1:
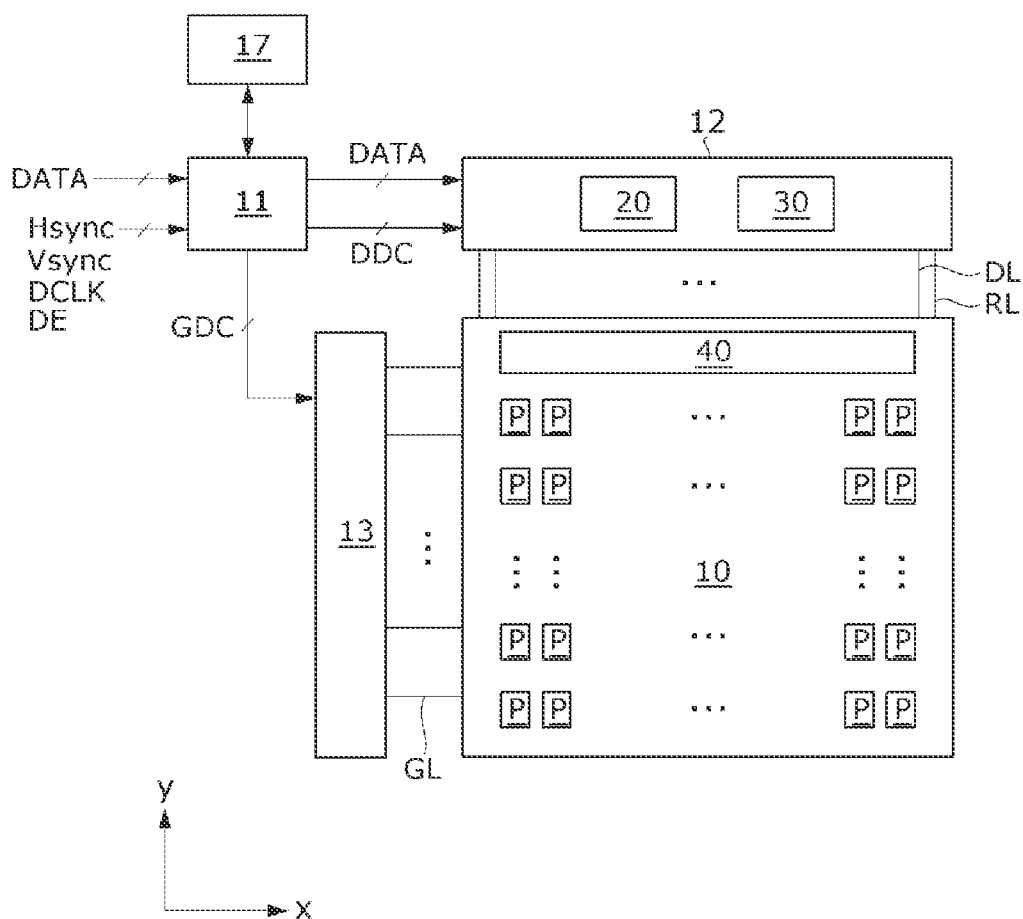
FIG. 1 is a schematic block diagram illustrating a display device according to embodiments of the present disclosure.

The advantages and features of the present disclosure and methods for accomplishing the same will be more clearly understood from embodiments described below with reference to the accompanying drawings. However, the present disclosure is not limited to the following embodiments but can be implemented in various different forms. Rather, the present embodiments will make the disclosure of the present disclosure complete and allow those skilled in the art to completely comprehend the scope of the present disclosure. The present disclosure is only defined within the scope of accompanying claims.

The shapes, sizes, ratios, angles, numbers, and the like illustrated in the accompanying drawings for describing the embodiments of the present disclosure are merely examples, and the present disclosure is not limited thereto. Like reference numerals generally denote like components throughout the present specification. Further, in describing the present disclosure, detailed descriptions of known related technologies can be omitted to avoid unnecessarily obscuring the subject matter of the present disclosure.

The terms such as "comprising," "including," and "having," used herein are generally intended to allow other components to be added unless the terms are used with the term "only." Any references to singular can include plural unless expressly stated otherwise.

Components are interpreted to include an ordinary error range even if not expressly stated.

When the position relation between two components is described using the terms such as "on," "above," "below," and "next," one or more components can be positioned between the two components unless the terms are used with the term "immediately" or "directly."

The terms "first," "second," and the like can be used to distinguish components from each other, but the functions or structures of the components are not limited by ordinal numbers or component names in front of the components. These terms may not define any order.

The following embodiments can be partially or entirely coupled to or combined with each other and can be interlocked and operated in technically various ways. The embodiments can be carried out independently of or in association with each other.

Hereinafter, a display device according to embodiments of the present specification will be described with reference to the accompanying drawings. Like reference numerals refer to like components throughout the specification. In the following descriptions, detailed descriptions of known functions and configurations incorporated herein will be omitted or given briefly when it can make the subject matter of the present disclosure rather unclear.

FIG. 1 is a schematic block diagram illustrating a display device according to embodiments of the present disclosure. All the components of the display device according to all embodiments of the present disclosure are operatively coupled and configured.

Referring to FIG. 1, the display device of the present disclosure includes a display panel 10, a timing controller 11, a source driver 12, and a gate driver 13 at least.

A plurality of pixels P, a plurality of data lines DL, a plurality of reference voltage lines RL, and a plurality of gate lines GL are disposed on the display panel 10.

The pixels P are arranged in a matrix form on a screen of the display panel 10 to form a pixel array. Each of the pixels P can be divided into a red subpixel, a green subpixel, and a blue subpixel to represent colors. Each of the pixels can further include a white subpixel, or the pixels P can have any of the various combinations of color subpixels known in the art. Each of the subpixels can include a pixel circuit shown in FIG. 2.

Each of the subpixels is connected to any one of the data lines DL to which a data voltage is supplied, to any one of the reference voltage lines RL to which a reference voltage is supplied, and to any one of the gate lines GL. Each pixel P receives high potential driving power and low potential driving power from a power generator. For example, the power generator can supply the high potential driving power through a high potential driving power line or a pad unit. The power generator can supply the low potential driving power through a low potential driving power line or the pad unit.

The display device includes at least one external compensation circuit. External compensation circuit technology refers to technology for sensing electrical characteristics of driving elements provided in the pixels P and correcting input video data DATA according to sensing values. For example, a sensing unit is configured to compensate for a luminance deviation between the pixels P according to the electrical characteristics of the driving element such as a threshold voltage of the driving element and an electron mobility of the driving element.

The display panel 10 can further include a switch array 40. However, the present disclosure is not limited thereto. The switch array 40 can include a demultiplexer (DEMUX) connected between an output pin of the source driver 12 and the data lines DL. The DEMUX can reduce the number of channels of the source driver 12 by time-dividing a data voltage output from one channel of the source driver 12 and distributing the time-divided data voltages to two or more data lines DL.

The source driver 12 includes a data voltage supply unit 20 which supplies a data voltage to the display panel 10.

The data voltage supply unit 20 of the source driver 12 includes a plurality of digital-to-analog converters (hereinafter, referred to as "DACs"). During display driving, the data voltage supply unit 20 converts digital data DATA of a corrected input image input from the timing controller 11 into a display data voltage through the DAC.

During sensing driving, the data voltage supply unit 20 of the source driver 12 generates a sensing data voltage through the DAC under control of the timing controller 11. The sensing data voltage is a voltage applied to a gate electrode of a driving element provided in each pixel P during sensing driving.

The source driver 12 can further include a sensing unit 30. However, the present disclosure is not limited thereto.

The timing controller 11 is configured to receive the video data DATA and timing signals such as a vertical synchronization signal Vsync, a horizontal synchronization signal Hsync, a dot clock signal DCLK, and a data enable signal DE input from a host system. However, the present disclosure is not limited thereto.

The timing controller 11 is configured to generate a data control signal DDC for controlling an operation timing of the source driver 12 and a gate control signal GDC for controlling an operation timing of the gate driver 13 based on the input signals.

The data control signal DDC includes a source start pulse, a source sampling clock, a source output enable signal, and the like. The source start pulse controls a data sampling start timing of the source driver 12. The source sampling clock is a clock signal for controlling a sampling timing of data based on a rising or falling edge. The source output enable signal controls an output timing of the source driver 12.

The gate control signal GDC includes a gate start pulse, a gate shift clock, and the like. The gate start pulse is applied to a gate stage of the gate driver 13, which generates a first output, thereby controlling the gate stage. The gate shift clock is a clock signal that is commonly input to gate stages and shifts the gate start pulse.

For example, the timing controller 11 can generate the control signals DDC and GDC for display driving and the control signals DDC and GDC for sensing driving differently. However, the present disclosure is not limited thereto.

The timing controller 11 is configured to control sensing driving for sensing electrical characteristics of a driving thin film transistor TFT and updating corresponding compensation values and display driving for displaying an input image reflecting the compensation values in each of the pixels P.

The timing controller 11 can be configured to separate the sensing driving and the display driving according to a set control sequence, but the present disclosure is not limited thereto. For example, under control of the timing controller 11, the sensing driving can be performed in a vertical blank period during display driving, in a power-on sequence period before display driving, or in a power-off sequence period after display driving, but the present disclosure is not limited thereto. The sensing driving can be performed during the display driving.

The vertical blank period is a period in which the input image data DATA is not written and which is disposed between vertical active sections in which one frame of the input image data DATA is written. The power-on sequence period refers to a transient period from a point in time at which driving power is turned on to a point in time at which an input image is displayed. The power-off sequence period refers to a period from a point in time at which image displaying is ended to a point in time at which driving power is turned off. However, the sensing driving is not limited to the above-described periods.

For example, according to a preset sensing process, the timing controller 11 can sense a standby mode, a sleep mode, a low power mode, and the like and can control all operations for sensing driving. That is, the sensing driving can be performed in a state in which only a screen of the display device is turned off while system power is still being applied, for example, in a standby mode, a sleep mode, a low power mode, or the like. However, the present disclosure is not limited thereto.

During a sensing driving, the timing controller 11 is configured to calculate compensation parameters capable of compensating for a change in electrical characteristics of the driving element of the pixel P based on digital sensing values input from the source driver 12.

For example, an organic light-emitting display device includes a memory 17 or is configured to communicate with the memory 17. The compensation parameters can be stored in the memory 17. The compensation parameters stored in the memory 17 can be updated each time when sensing driving is performed, and thus, time-varying characteristics of the driving element can be easily compensated for. However, the present disclosure is not limited thereto.

During a display driving, the timing controller 11 reads the compensation parameters from the memory 17, corrects the digital data DATA of the input image based on the compensation parameters, and supplies the corrected digital data DATA to the source driver 12.

The gate driver 13 can be implemented as a gate-in panel (GIP) circuit formed directly on the display panel 10 together with circuit components and lines of the pixel array. The GIP circuit can be disposed in a bezel region that is a non-display region of the display panel 10 or can be distributed and disposed in the pixel array. The gate driver 13 sequentially supplies scan signals synchronized with the data voltage to the gate lines GL under control of the timing controller 11. The gate driver 13 can sequentially supply the scan signals to the gate lines GL by shifting the scan signals using a shift register.

The host system can be any one of a television (TV), a set-top box, a navigation system, a personal computer (PC), a home theater system, a mobile device, a wearable device, a vehicle system, or any other suitable host device/system.

Figure 2:
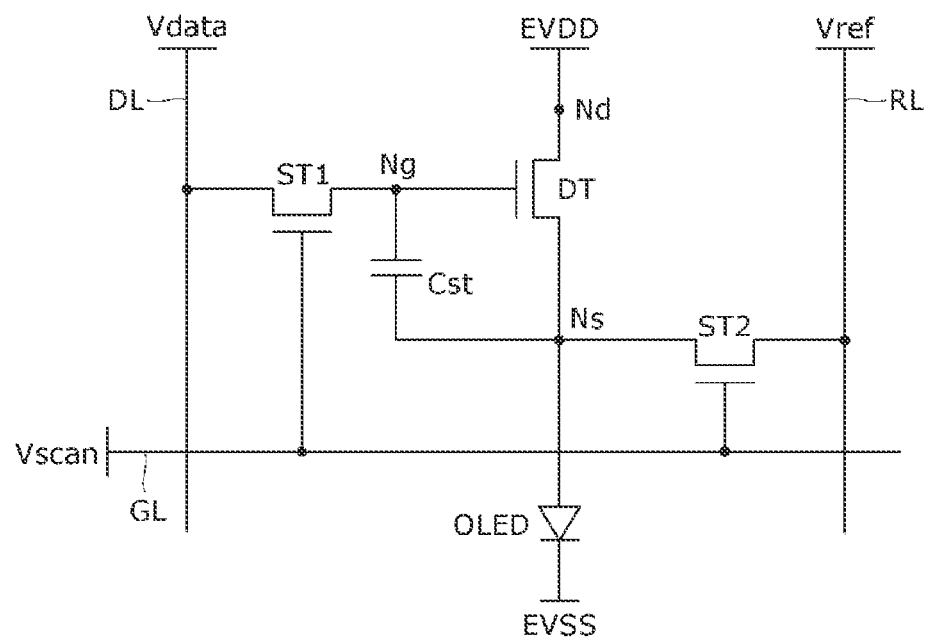
FIG. 2 is a circuit diagram illustrating an example of a pixel circuit which can be used in the display device.

FIG. 2 is a circuit diagram illustrating an example of a pixel circuit which can be used in the display panel of FIG. 1 or other display panel of the present disclosure.

Hereinafter, referring to FIG. 2, the pixel circuit is connected to a data line DL to which a data voltage Vdata is supplied, a reference voltage line RL to which a reference voltage Vref is supplied, and a gate line GL to which a scan signal Vscan is supplied. The scan signal Vscan is a signal that swings between a gate high voltage VGH and a gate low voltage VGL.

A pixel P includes a light-emitting element OLED, a driving element DT, a first switch element ST1, a second switch element ST2, and a storage capacitor Cst. Each of the driving element DT and the switch elements ST1 and ST2 can be implemented as a transistor.

The light-emitting element OLED can be implemented as an organic light-emitting diode (OLED) including an organic compound layer formed between an anode and a cathode. The organic compound layer can include a hole injection layer (HIL), a hole transport layer (HTL), an emission layer (EML), an electron transport layer (ETL), an electron injection layer (EIL), and the like, but the present disclosure is not limited thereto. The light-emitting element OLED is a light-emitting element which is connected between a third node Ns connected to a source electrode of the driving element DT and a low potential driving power supply EVSS and emits light according to a driving current. The light-emitting element OLED can be configured to emit red light, green light, blue light, or white light.

The driving element DT includes a gate electrode connected to a first node Ng, a drain electrode connected to a second node Nd, and the source electrode connected to the third node Ns. The driving element DT drives the light-emitting element OLED by controlling an amount of a current applied to the light-emitting element OLED according to a gate-source voltage Vgs. A pixel driving voltage EVDD can be applied to the drain electrode of the driving element DT.

The first switch element ST1 includes a gate electrode connected to the gate line GL, a drain electrode connected to the data line DL, and a source electrode connected to the first node Ng. The first switch element ST1 is turned on in response to the scan signal Vscan from the gate line GL. When the first switch element ST is turned on, the data line DL, to which the data voltage Vdata is applied, is electrically connected to the first node Ng so that the data voltage Vdata is applied to the gate electrode of the driving element DT and the storage capacitor Cst.

The second switch element ST2 includes a gate electrode connected to the gate line GL, a drain electrode connected to the reference voltage line RL, and a source electrode connected to the third node Ns. The second switch element ST2 is turned on in response to the scan signal Vscan from the gate line GL to electrically connect the reference voltage line RL and the third node Ns, thereby allowing the reference voltage Vref to be applied to the third node Ns. The reference voltage Vref is set to a voltage lower than the pixel driving voltage EVDD. Meanwhile, the second switch element ST2 can be turned on when electrical characteristics of the driving element DT need to be sensed. In this case, a sensing signal from the gate driver 13 can be applied to the gate electrode of the second switch element ST2. Since the sensing signal can be generated independently of the scan signal Vscan, a turn-on or off timing of the second switch element ST2 can be controlled at a desired sensing time.

The storage capacitor Cst is connected between the first node Ng and the third node Ns to maintain the gate-source voltage Vgs of the driving element DT during an emission period. As the gate-source voltage Vgs is increased, a driving current is increased, and accordingly, a light emission amount of the pixel P is increased. In other words, luminance of the pixel P is increased in proportion to a voltage applied to the first node Ng, that is, the data voltage Vdata.

Pixel circuits adjacent to each other are connected to at least one reference voltage line RL. For example, four pixel circuits can share one reference voltage line RL. According to such a configuration, since the number of the reference voltage lines RL can be reduced, there is an advantage in that an aperture ratio can be increased. That is, since the number of the reference voltage lines RL is reduced, more subpixels can be disposed. Therefore, there is an advantage in that resolution can be increased. However, the present disclosure is not limited thereto, and the number of the reference voltage lines RL and the number and type of the pixels P sharing the reference voltage line RL can be variously modified and implemented.

Figure 3:
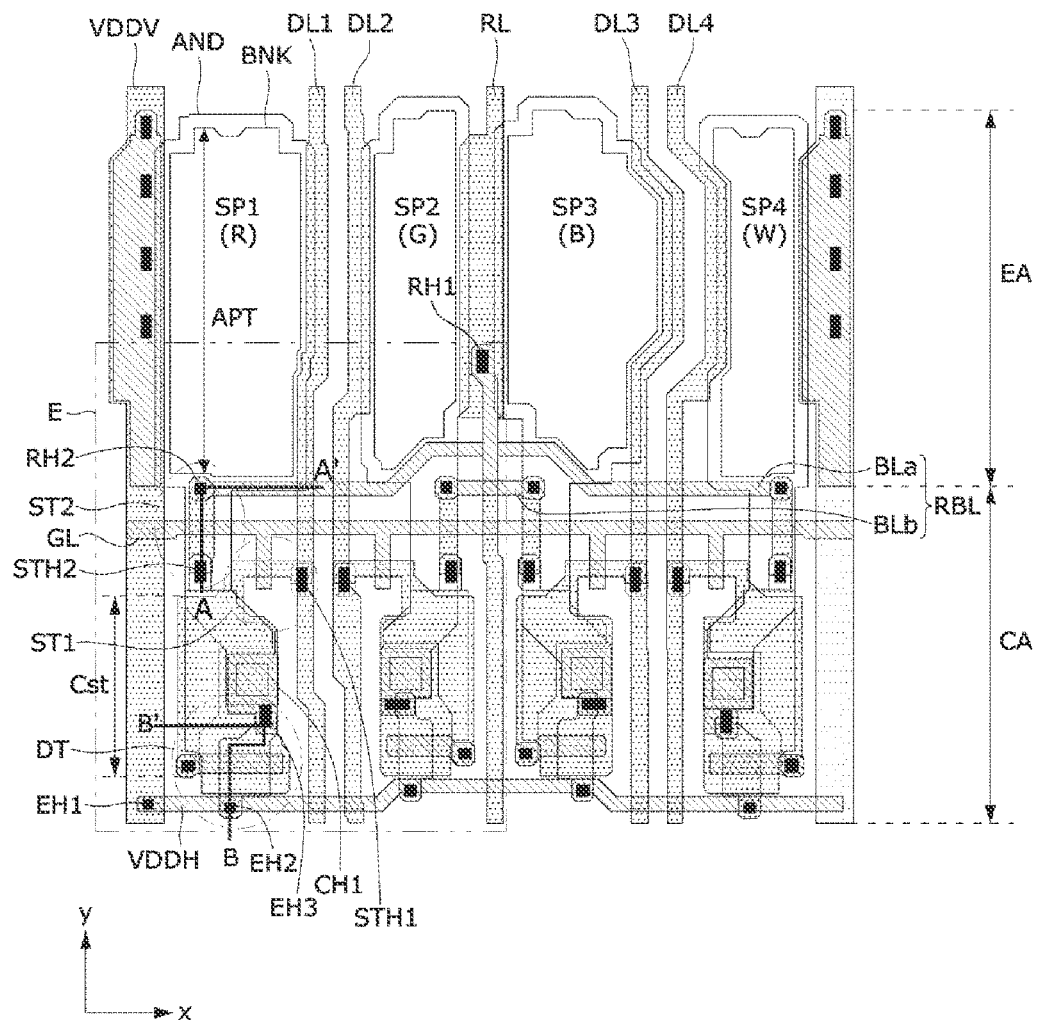
FIG. 3 is a plan view illustrating a pixel of a display panel according to a first embodiment of the present disclosure.

FIG. 3 is a plan view illustrating a pixel P of a display panel 10 according to a first embodiment of the present disclosure.

Referring to FIG. 3, each pixel P includes subpixels SP1 to SP4 each including an emission part EA and a circuit part CA.

The subpixels SP1 to SP4 are arranged in a first direction (for example, an x-axis direction). As an example of color subpixels, a first subpixel SP1 can be a red subpixel R, a second subpixel SP2 can be a green subpixel G, a third subpixel SP3 can be a blue subpixel B, and a fourth subpixel SP4 can be a white subpixel W, but the present disclosure is not limited thereto. Since the green and white subpixels G and W have relatively high light efficiency and luminance contribution rate, the size thereof can be smaller than that of the red and blue subpixels R and B.

The emission part EA includes a light-emitting element OLED. The circuit part CA includes a driving element DT for driving the light-emitting element OLED, a first switch element ST1, a second switch element ST2, a storage capacitor Cst, and the like.

In the first embodiment, the emission part EA and the circuit part CA are arranged in a second direction (y-axis direction) intersecting the first direction x. In each of the subpixels SP1 to SP4, the light-emitting element OLED can be driven by a pixel circuit implemented in the circuit part CA, thereby emitting light.

In each of the subpixels SP1 to SP4, an emission region is defined by a bank BNK which is formed on an anode AND of the light-emitting element OLED to expose a portion of the anode AND. That is, the anode AND exposed by the bank BNK can be regarded as the emission region of each of the subpixels SP1 to SP4.

Lines of a pixel array include horizontal lines and vertical lines for applying driving signals to the subpixels SP1 to SP4. The pixels P can share the horizontal lines and the vertical lines. The vertical line is disposed between adjacent subpixels SP1 to SP4.

The vertical lines can include a vertical power line VDDV, a reference voltage line RL, and data lines DL1 to DL4. The vertical lines are lines that pass between the subpixels SP1 to SP4 adjacent in the first direction x and extend and have a long line shape in the second direction y.

The horizontal lines can include a gate line GL and a horizontal power line VDDH. The horizontal line intersects the vertical lines. The horizontal lines are lines that extend in the first direction x.

Lines connected to pixels and electrodes constituting transistors can be disposed on the same layer or on different layers with one or more insulating layers interposed therebetween and can be interconnected through contact holes that pass through the insulating layers for an electrical connection.

First to fourth data lines DL1 to DL4 can be connected to the first switch elements ST1 of corresponding subpixels SP. The gate line GL can be connected to the first switch element ST1 of each of the subpixels SP1 to SP4. The gate line GL can be connected to the second switch element ST2 of each of the subpixels SP1 to SP4.

A pixel driving voltage EVDD is commonly applied to the pixel circuits of the subpixels SP1 to SP4 through the vertical power line VDDV and the horizontal power line VDDH. The vertical power line VDDV can be connected to the driving element DT of each of the subpixels SP1 to SP4 through the horizontal power line VDDH. The horizontal power line VDDH is disposed in the circuit part CA. The horizontal power line VDDH extends in the first direction and transmits a signal from the vertical power line VDDV extending in the second direction to the subpixels SP1 to SP4 arranged in the first direction. The horizontal power line VDDH is disposed on a different layer from the vertical power line VDDV and is electrically connected to the vertical power line VDDV through a first power contact hole EH1. The horizontal power line VDDH is disposed on a different layer from a drain electrode of the driving element DT and is electrically connected to the drain electrode through a second power contact hole EH2.

A reference voltage Vref applied to the reference voltage line RL is applied to one or more subpixels SP1 to SP4 through (or via) a branch line RBL. The branch line RBL can be connected to the second switch element ST2 of each of the subpixels SP1 to SP4. The branch line RBL is disposed in the circuit part CA. The branch line RBL extends in the first direction and transmits a signal from the reference voltage line RL extending in the second direction to the subpixels SP1 to SP4 arranged in the first direction. More specifically, a first branch line BLa connects the reference voltage line RL and two subpixels SP1 and SP4 at both ends thereof, and a second branch line BLb connects the reference voltage line RL and two intermediate subpixels SP2 and SP3. The branch line RBL is disposed on a different layer from the reference voltage line RL and is electrically connected to the reference voltage line RL through a first reference contact hole RH1. Since the first branch line BLa is connected to the first and fourth subpixels spaced apart from each other with two subpixels SP2 and SP3 interposed therebetween, the first branch line BLa is longer than the second branch line BLb. A central portion of the first branch line BLa is concavely bent so as to not interfere with the second branch line BLb. The second branch line BLb is disposed below the concave central portion of the first branch line BLa and is connected to the adjacent second and third subpixels SP2 and SP3. Since the central portion of the first branch line BLa is concavely patterned to pass below the bank BNK, the loss of emission regions of the subpixels SP1 to SP4 caused by the branch line RBL can be reduced, thereby increasing an aperture ratio.

The branch line RBL is disposed on the same layer as a drain electrode of the second switch element ST2, and the branch line RBL is electrically connected to an active layer of the second switch element ST2 through a contact hole RH2. The drain electrode D2 of the second switch element ST2 can be integrated with the branch line RBL.

A gate electrode of the first switch element ST1 of the present disclosure is a portion of the gate line GL or is formed by being branched off from the gate line GL. A drain electrode of the first switch element ST1 is a portion of the data line DL or is formed by being branched off from the data line DL. An active layer of the first switch element ST1 is connected to the drain electrode thereof through a contact hole STH1 passing through a buffer layer BUF (see FIG. 4). A source electrode of the first switch element ST1, which is positioned opposite to the drain electrode thereof with the gate electrode thereof interposed therebetween, is connected to a gate electrode of the driving element DT.

In each of the subpixels SP1 to SP4, the anode AND of the light-emitting element OLED disposed in the emission part EA extends in the second direction and is electrically connected to a corresponding driving element DT and storage capacitor Cst in the circuit part CA.

Next, a cross-sectional structure of the display panel according to the first embodiment of the present disclosure will be described with reference to FIGS. 4 and 5.

Figure 4:
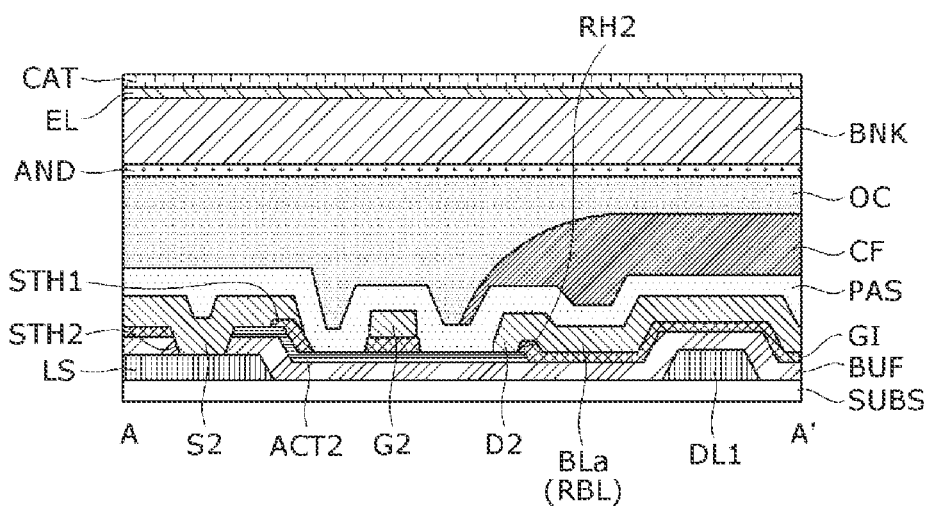
FIG. 4 is a cross-sectional view of the display panel taken along line A-A' in FIG. 3.

FIG. 4 is a cross-sectional view taken along line A-A' in the first subpixel SP1 in FIG. 3 which illustrates a cross-sectional structure of the second switch element ST2 and the branch line RBL shown in FIG. 3. FIG. 5 is a cross-sectional view taken along line B-B' in the first subpixel SP1 in FIG. 3 which illustrates a cross-sectional structure of the driving element DT, the storage capacitor Cst, and the horizontal power line VDDH.

Referring to FIG. 4, the display panel 10 includes a first metal layer disposed on a substrate SUBS, the buffer layer BUF, a semiconductor layer, a first insulating layer GI, a second metal layer, a second insulating layer PAS, a third insulating layer OC, the anode AND, an organic compound layer EL, a cathode CAT, a color filter CF, and the bank BNK. The first metal layer includes the data line DL1 and a light-shield metal pattern LS at least. The second metal layer includes electrodes of the second switch element ST2. Although not visible in a cross section taken along line A-A', electrodes of all transistors DT, ST1, and ST2 constituting the pixel circuit are also formed of patterns of the second metal layer. Each of the first and second metal layers can be implemented as a single-metal layer or a double-metal layer in which different types of metal layers are stacked. The semiconductor layer includes an active layer ACT2 of the second switch element ST2 at least.

The data line DL1 and the light-shield metal pattern LS are disposed on the substrate SUBS. The data line DL1 can be made of the same first metal on the same layer as the light-shield metal pattern LS. The light-shield metal pattern LS can be disposed only below a channel region (or active layer) of the driving element DT or can be not disposed only below the channel region of the driving element DT but also below channel regions of the first and second switch elements ST1 and ST2. The light-shield metal pattern LS can be used for the purpose of blocking external light or can be connected to other electrodes or lines and be used as an electrode of a capacitor.

The buffer layer BUF can be disposed on the substrate SUBS on which the data line DL1 and the light-shield metal pattern LS are disposed. The buffer layer BUF can include one or more inorganic insulating material layers to serve to block ions or impurities diffused from the substrate SUBS and block permeation of external moisture.

The second switch element ST2 and the first branch line BLa are formed on the buffer layer BUF. Although not visible in the cross section taken along line A-A' of FIG. 3, the second branch line BLb can also be formed on the buffer layer BUF.

The second switch element ST2 includes the active layer ACT2, a gate electrode G2, a source electrode S2, and a drain electrode D2. The active layer ACT2 is disposed on the buffer layer BUF. The active layer ACT2 is made of a semiconductor. The semiconductor can be any one selected from an oxide semiconductor, polysilicon, and amorphous silicon.

The active layer ACT2 can be divided into a channel region, a source region provided at one side of the channel region, and a drain region provided at the other side of the channel region. When the source region and the drain region of the active layer ACT2 are doped with ions, the gate electrode G2 formed of the second metal layer serves as a mask so that the channel region below the gate electrode G2 is not doped with ions.

The gate electrode G2 is disposed on the channel region of the active layer ACT2 with the first insulating layer GI interposed therebetween. The first insulating layer GI can be formed as a silicon oxide (SiOx) film or a silicon nitride (SiNx) film, but the present disclosure is not limited thereto. The first insulating layer GI can be a gate insulating layer. The gate electrode G2 can be a portion of the gate line GL or can be a portion branched off from the gate line GL. That is, the gate electrode G2 and the gate line GL can be made of the same second metal disposed on the same layer.

The source electrode S2 and the drain electrode D2 are disposed on the buffer layer BUF to be spaced apart from each other with the gate electrode G2 interposed therebetween. The source electrode S2 and the drain electrode D2 can be made of the same second material disposed on the same layer as the gate electrode G2. The first insulating layer GI is disposed between the source electrode S2 and the buffer layer BUF. The first insulating layer GI is also disposed between the drain electrode D2 and the buffer layer BUF.

The source electrode S2 is connected to the source region of the active layer ACT2 through a second source contact hole STH1 passing through the first insulating layer GI. The source electrode S2 is connected to the light-shield metal pattern LS through a second switch contact hole STH2 passing through the buffer layer BUF. As described above, the light-shield metal pattern LS can be used to facilitate a connection with other electrodes or lines, and thus, the light-shield metal pattern LS can be a portion of a node for electrically connecting the source electrode S2 to a source electrode of the driving element DT or the anode AND of the light-emitting element OLED.

The drain electrode D2 is connected to the drain region of the active layer ACT2 through a second drain contact hole RH2 passing through the first insulating layer GI.

The branch line BLa formed on the buffer layer BUF can be made of the same metal disposed on the same layer as the gate electrode, the source electrode, and the drain electrode of the second switch element ST2. The drain electrode D2 can be a portion of the branch line BLa or can be a portion branched off from the branch line BLa.

The second insulating layer PAS is disposed on the second switch element ST2 and the branch line BLa. The second insulating layer PAS can be a passivation film. The passivation film can be an insulating layer which protects elements thereunder and can be a silicon oxide (SiOx) film, a silicon nitride (SiNx) film, or a multi-layer in which two or more thereof are stacked.

The third insulating layer OC can be disposed on the second insulating layer PAS. The third insulating layer OC can be a planarization film for reducing a step difference of a structure thereunder and can be made of an organic material such as polyimide, a benzocyclobutene series resin, or acrylate. If necessary, any one of the passivation film and the planarization film can be omitted. The color filter CF can be disposed between the second insulating layer PAS and the third insulating layer OC.

The light-emitting element OLED is disposed on the third insulating layer OC. The light-emitting element OLED includes the anode AND and a cathode CAT which are opposite to each other with the organic compound layer EL interposed therebetween.

Since the display device according to the present disclosure is implemented as a bottom emission type, the anode AND can serve as a transparent electrode. As an example, the anode AND can be made of a transparent electrode material such as indium tin oxide (ITO), indium zinc oxide (IZO), or zinc oxide (ZnO).

The bank BNK is disposed on the substrate SUBS on which the anode AND is formed. The bank BNK can be made of an organic material such as polyimide, a benzocyclobutene series resin, or acrylate.

The organic compound layer EL is disposed on the substrate SUBS on which the bank BNK is formed. The organic compound layer EL includes an emission layer EML in which electrons and holes are combined to emit light. The organic compound layer EL includes one or more of an HIL, an HTL, an ETL, and an EIL.

The cathode CAT is disposed on the organic compound layer EL. The cathode CAT can be widely formed on an entire surface of the substrate SUBS. The display device according to the present disclosure can be implemented as a bottom emission type. In this case, the cathode CAT can serve as a reflective electrode. For example, the cathode CAT can be made of a reflective material having a low work function, such as magnesium (Mg), calcium (Ca), aluminum (Al), silver (Ag), or an alloy thereof.

Figure 5:
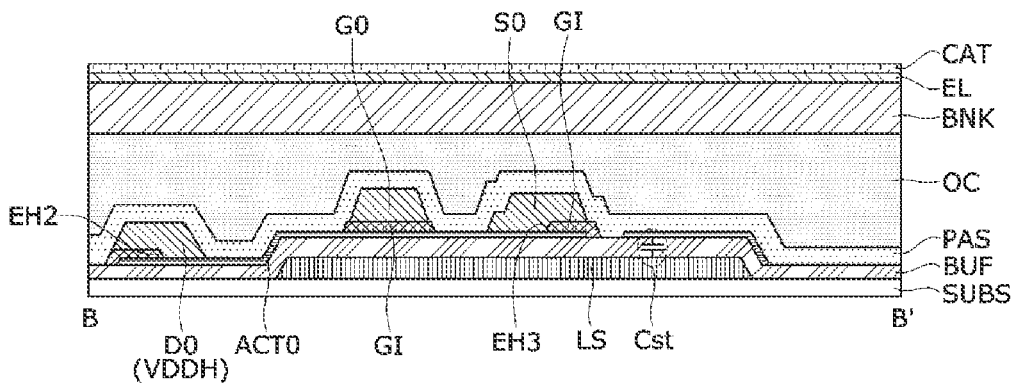
FIG. 5 is a cross-sectional view of the display panel taken along line B-B' in FIG. 3.

Referring to FIG. 5, the display panel 10 includes the first metal layer disposed on the substrate SUBS, the buffer layer BUF, the semiconductor layer, the first insulating layer GI, the second metal layer, the second insulating layer PAS, the third insulating layer OC, the driving element DT, the light-emitting element OLED, and the bank BNK. The first metal layer includes the light-shield metal pattern LS. The second metal layer includes electrodes of the driving element DT. Each of the first and second metal layers can be implemented as a single-metal layer or a double-metal layer in which different types of metal layers are stacked. The semiconductor layer includes an active layer ACT0 of the driving element DT at least.

The light-shield metal pattern LS is disposed on the substrate SUBS. The light-shield metal pattern LS can be disposed only below the channel region (or active layer) of the driving element DT or can be not disposed only below the channel region of the driving element DT but also below the channel regions of the first and second switch elements ST1 and ST2. The light-shield metal pattern LS can be used for the purpose of simply blocking external light or can facilitate a connection with other electrodes or lines and can be used as an electrode constituting a capacitor or the like.

The buffer layer BUF can be disposed on the substrate SUBS on which the light-shield metal pattern LS is disposed. The buffer layer BUF can serve to block ions or impurities diffused from the substrate SUBS and block permeation of external moisture.

The driving element DT and the horizontal power line VDDH are formed on the buffer layer BUF. The driving element DT includes the active layer ACT0, a gate electrode G0, a source electrode S0, and a drain electrode D0.

The active layer ACT0 is disposed on the buffer layer BUF. The active layer ACT0 can be divided into a channel region, a source region provided at one side of the channel region, and a drain region provided at the other side of the channel region. The active layer ACT0 is made of a semiconductor that is non-metalized. The semiconductor can be any one selected from an oxide semiconductor, polysilicon, and amorphous silicon.

The gate electrode G0 is disposed on the channel region of the active layer ACT0 with the first insulating layer GI interposed therebetween. The first insulating layer GI can be formed as a silicon oxide (SiOx) film or a silicon nitride (SiNx) film, but the present disclosure is not limited thereto.

Here, the first insulating layer GI can be a gate insulating layer GI. The gate electrode G0 can be disposed between the source electrode S0 and the drain electrode D0 to be spaced apart from the source electrode S0 and the drain electrode D0. The gate electrode G0 can be made of the same material disposed on the same layer as the source electrode S0 and the drain electrode D0.

The source electrode S0 and the drain electrode D0 are spaced apart from each other on the buffer layer BUF with the gate electrode G0 interposed therebetween. The source electrode S0 and the drain electrode D0 can be made of the same material disposed on the same layer as the gate electrode G0. The first insulating layer GI is disposed between the source electrode S0 and the buffer layer BUF. The first insulating layer GI is also disposed between the drain electrode D0 and the buffer layer BUF.

The source electrode S0 is connected to the source region of the active layer ACT0 through a source contact hole EH3 passing through the first insulating layer GI. As shown in FIG. 3, the source electrode S0 is electrically connected to the anode AND of the light-emitting element OLED through a pixel contact hole CH1.

The drain electrode D0 is connected to the drain region of the active layer ACT0 through a drain contact hole EH2 passing through the first insulating layer GI. The drain electrode D0 can be a portion of the horizontal power line VDDH or can be a portion branched off from the horizontal power line VDDH.

The display panel 10 can further include one electrode of the storage capacitor Cst disposed on the buffer layer BUF to be spaced apart from the active layer ACT0 of the driving element DT. One electrode of the storage capacitor Cst can include a semiconductor integrated with the active layer ACT0 of the driving element DT. The semiconductor used as one electrode of the storage capacitor Cst can be metalized.

The storage capacitor Cst includes one electrode formed of a metalized semiconductor pattern, the buffer layer BUF, and the light-shield metal pattern LS overlapping the semiconductor pattern with the buffer layer BUF interposed therebetween. Therefore, a portion of the light-shield metal pattern LS also serves as the other electrode of the storage capacitor Cst. As described above, the storage capacitor Cst can be connected between a first node Ng and a third node Ns of the driving element DT.

The second insulating layer PAS is disposed on the driving element DT and the horizontal power line VDDH. The second insulating layer PAS can be a passivation film. The passivation film can be an insulating layer which protects elements thereunder and can be a silicon oxide (SiOx) film, a silicon nitride (SiNx) film, or a multi-layer in which the silicon oxide (SiOx) film and the silicon nitride (SiNx) film are stacked.

The third insulating layer OC can be disposed on the second insulating layer PAS. The third insulating layer OC can be a planarization film for reducing a step difference of a structure thereunder and can be made of an organic material such as polyimide, a benzocyclobutene series resin, or acrylate. If necessary, any one of the passivation film and the planarization film can be omitted.

The light-emitting element OLED is disposed on the third insulating layer OC. The light-emitting element OLED includes the anode AND, the organic compound layer EL, and the cathode CAT. Since the anode AND is not visible in a cross section taken along line B-B', the anode AND is not specifically shown in FIG. 4.

As shown in FIG. 3, the anode AND is connected to the source electrode S0 of the driving element DT through the pixel contact hole CH1 passing through the second and third insulating layers PAS and OC. The display device according to the present disclosure can be implemented as a bottom emission type. To this end, the anode of the light-emitting element can serve as a transparent electrode. As an example, the anode AND can be made of a transparent electrode material such as ITO, IZO, or ZnO.

The bank BNK is disposed on the third insulating layer OC. The bank BNK can be made of an organic material such as polyimide, a benzocyclobutene series resin, or acrylate.

The bank BNK can expose the anode in an opening of the subpixel and can cover an edge of the anode AND. The bank BNK defines an emission region of the subpixel through which light from the light-emitting element OLED is emitted to the outside. The emission region includes a region of the anode which is exposed in the opening defined in the emission part EA of each of the subpixels SP1 to SP4 by the bank BNK. In the emission region defined by the bank BNK, most of the anode AND of the light-emitting element OLED is exposed. The emission region is substantially the same as an opening APT in FIG. 3 in which the anode AND is exposed without metal.

All thin film layers in the emission region can be formed of 90% or more of a medium.

The organic compound layer EL is disposed on the substrate SUBS on which the bank BNK is formed. The organic compound layer EL can include the emission layer EML which is a layer in which electrons and holes are combined to emit light and can include one or more of the HIL, the HTL, the ETL, and the EIL.

The cathode CAT is disposed on the organic compound layer EL. The cathode CAT can be widely formed on the entire surface of the substrate SUBS. In a bottom emission type, the cathode CAT can serve as a reflective electrode. For example, the cathode CAT can be made of a reflective material having a low work function, such as magnesium (Mg), calcium (Ca), aluminum (Al), silver (Ag), or an alloy thereof.

Figure 6A:
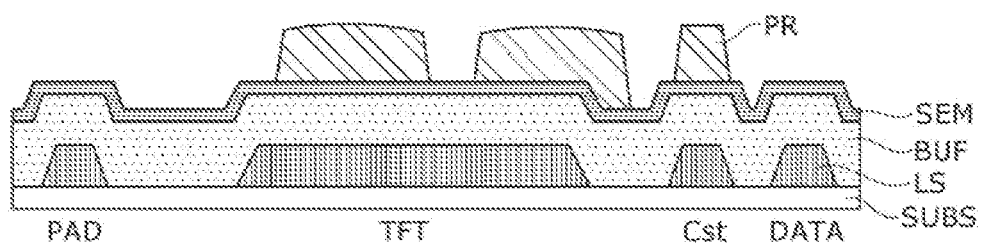
FIGS. 6A to 6C are cross-sectional views illustrating a process of forming a semiconductor pattern shown in FIGS. 4 and 5.
Figure 6B:
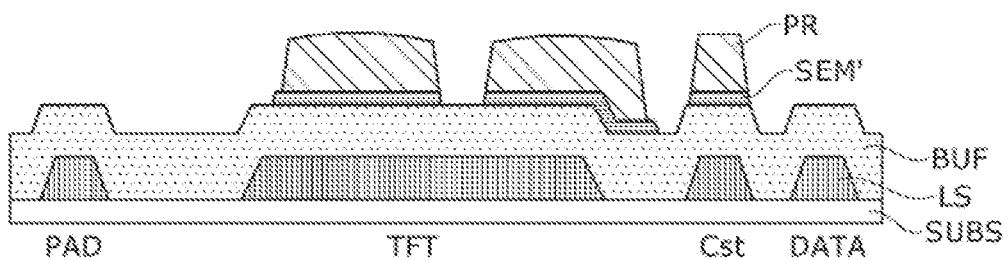
Figure 6C:
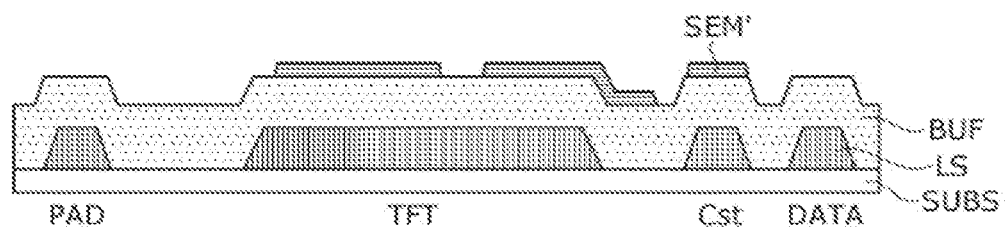

In the display panel 10 shown in FIGS. 3 to 5, the active layers of the transistors DT, ST1, and ST2 can be implemented as a semiconductor pattern which is patterned into a desired shape using a photolithography process (hereinafter, referred to as a "photo process"). This will be described in conjunction with FIGS. 6A to 6C. In FIGS. 6A to 6C, reference symbol "PAD" represents a pad to which data lines DL and output pins of a source driver 12 are connected in a display panel 10. Reference symbol "APT" represents an opening of a subpixel. Reference symbol "TFT" represents a driving element of the display panel 10. Reference symbol "Cst" represents a storage capacitor of the display panel 10. Reference symbol "DATA" represents a data line of the display panel 10.

In a photo process, as shown in FIG. 6A, a semiconductor material is deposited on a buffer layer BUF to form a semiconductor layer SEM on the buffer layer BUF. An oxide semiconductor, for example, indium-gallium-zinc oxide (IGZO), can be selected as the semiconductor material. Hereinafter, it will be described that amorphous IGZO is used as the semiconductor material, but the present disclosure is not limited thereto.

In the photo process, as shown in FIG. 6B, after a photosensitive material layer is applied on the semiconductor layer SEM, a photomask imprinted with a desired pattern is aligned on the photosensitive material layer, and the photosensitive material is exposed through the photomask.

Subsequently, in the photo process, a developer is sprayed on the photosensitive material layer to melt and remove only an exposed portion of the photosensitive material layer. As a result, a semiconductor pattern SEM' having a desired shape remains below the photoresist pattern PR.

In the photo process, an etchant is sprayed on the photoresist pattern PR and the semiconductor pattern SEM'. Through such a wet etching process, as shown in FIG. 6C, an exposed portion of the semiconductor pattern SEM', which is not covered by the photoresist pattern PR, is removed.

FIGS. 7A to 7D are plan views illustrating a contact hole structure through which the semiconductor pattern SEM' and transistors DT, ST1, and ST2 are connected in the pixel circuit shown in FIG. 3. In FIGS. 7A to 7D, reference symbol "GM" represents a partial pattern of a second metal layer used as electrodes of the transistors DT, ST1, and ST2. The contact hole structure shown in FIGS. 7A to 7D can be any one of the contact holes CH1, STH1, and STH2 in FIG. 3 through which the semiconductor layer and the second metal layer are connected.

Figure 7A:
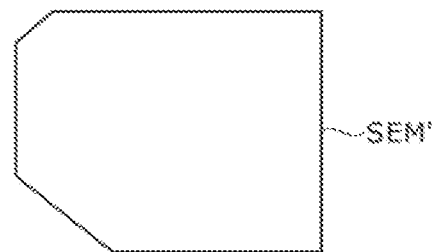
FIGS. 7A to 7D are plan views illustrating a contact hole structure of a pixel circuit shown in FIG. 3.
Figure 7B:
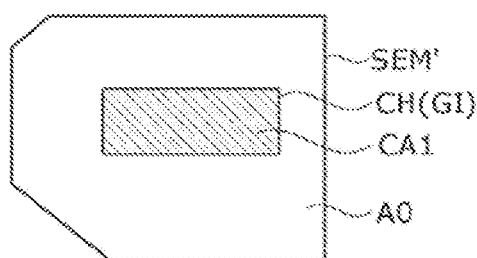

A first insulating layer GI is formed to cover the non-metalized semiconductor pattern SEM' as shown in FIG. 7A, and a portion of the first insulating layer GI is removed through a photo process. As a result, as shown in FIG. 7B, a portion of the semiconductor pattern SEM' is exposed through a contact hole CH(GI) from which the first insulating layer GI is removed. Here, the semiconductor pattern SEM' is a semiconductor layer which is not metalized.

A portion CA1 of the semiconductor pattern SEM', which is exposed by the contact hole CH(GI), is metalized. Conductivity of an oxide semiconductor (IGZO) varies according to an oxygen content. When the oxygen content is decreased, the conductivity of the oxide semiconductor (IGZO) is increased, and thus, the oxide semiconductor (IGZO) has a characteristic of a conductor to be metalized. As a method of reducing the oxygen content of the oxide semiconductor (IGZO), plasma treatment can be used. For example, when the oxide semiconductor is exposed to plasma, oxygen contained in the oxide semiconductor is removed, and thus, resistance of the oxide semiconductor (IGZO) is lowered. Accordingly, the oxide semiconductor (IGZO) can be metalized. Plasma treatment is a method of generating plasma discharge in a helium (He), hydrogen (H2), or argon (Ar) gas.

Figure 7C:
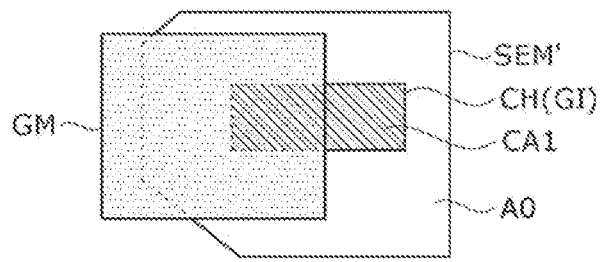

A second metal layer pattern GM is formed on the first insulating layer GI to cover a portion of the contact hole CH(GI). The second metal layer pattern GM can be a source electrode or a drain electrode of the transistors DT, ST1, and ST2. As shown in FIG. 7C, the second metal layer pattern GM covers a portion of the semiconductor pattern SEM' that is a non-conductor and a portion of the contact hole CH(GI) and thus, is in contact with the semiconductor pattern SEM' and the portion of the contact hole CH(GI).

Figure 7D:
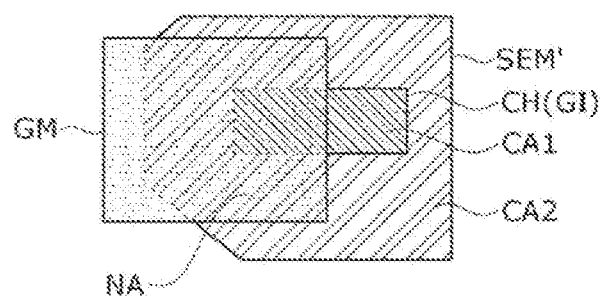

As shown in FIG. 7D, the remaining portion CA2 of the semiconductor pattern SEM', which is not covered by the second metal layer pattern GM, is metalized. In this case, a portion NA covered by the second metal layer pattern GM is not exposed to plasma and thus is not metalized.

In the display device according to the first embodiment of the present disclosure, due to one reference voltage line RL being shared by a plurality of subpixels SP1, SP2, SP3, and SP4 and due to a double-structure of a branch line RBL, an aperture ratio of the pixels can be increased.

Figure 8:
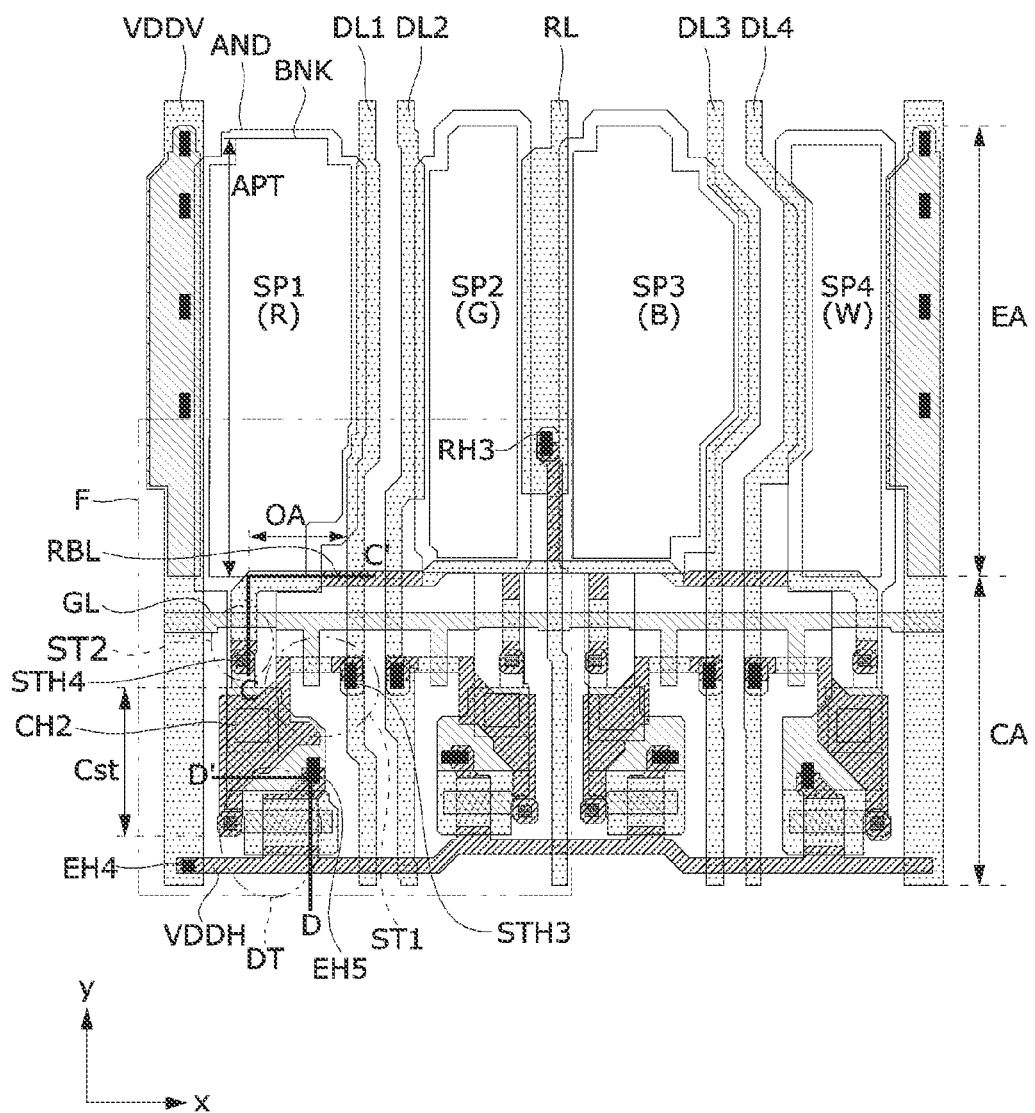
FIG. 8 is a plan view illustrating a pixel of a display panel according to a second embodiment of the present disclosure.

FIG. 8 is a plan view illustrating a pixel of a display panel 10 according to a second embodiment of the present disclosure.

Referring to FIG. 8, lines shared by pixels P include horizontal lines and vertical lines. The vertical line is disposed between adjacent subpixels SP1 to SP4. The vertical lines can include a vertical power line VDDV, a reference voltage line RL, and first to fourth data lines DL1 to DL4.

The horizontal lines can include a gate line GL, a horizontal power line VDDH, and the like. The horizontal line intersects the vertical lines. The horizontal lines can refer to lines extending in a first direction x.

Lines connected to the pixels and electrodes constituting transistors can be disposed on the same layer or on different layers with one or more insulating layers interposed therebetween and can be interconnected through contact holes that pass through the insulating layers for an electrical connection.

The first to fourth data lines DL1 to DL4 can be connected to first switch elements ST1 of corresponding subpixels SP. The gate line GL can be connected to the first switch element ST1 of each of the subpixels SP1 to SP4. The gate line GL can be connected to a second switch element ST2 of each of the subpixels SP1 to SP4.

The vertical power line VDDV can be connected to a driving element DT of each of the subpixels SP1 to SP4 through the horizontal power line VDDH. The horizontal power line VDDH is disposed in a circuit part CA. The horizontal power line VDDH extends in the first direction x and transmits a signal from the vertical power line VDDV extending in a second direction y to the subpixels SP1 to SP4 arranged in the first direction x. The horizontal power line VDDH is disposed on a different layer from the vertical power line VDDV and is electrically connected to the vertical power line VDDV through a first power contact hole EH4.

The horizontal power line VDDH can be disposed on the same layer as a drain electrode of the driving element DT. The horizontal power line VDDH can be implemented as a metalized semiconductor layer. In this case, since the metalized semiconductor layer is transparent, and the horizontal power line VDDH overlaps emission regions of the subpixels, it is possible to further expand openings and the emission regions of the subpixels.

At least a portion of the horizontal power line VDDH can be implemented in a multi-layered structure including a semiconductor layer and a third metal layer formed on the semiconductor layer. The third metal layer can be made of any one selected from copper (Cu) and molybdenum titanium (MoTi) or can be a double-metal layer in which copper (Cu) and molybdenum titanium (MoTi) are stacked. The third metal layer is in direct contact with the semiconductor layer in active layers of transistors, electrode of capacitors, and the like and is not present on the semiconductor layer in the emission regions of the subpixels. The third metal layer is stacked on the semiconductor layer and disposed between a first metal layer and a second metal layer.

The reference voltage line RL can be connected to the second switch element ST2 of each of the subpixels SP1 to SP4 through (or via) a branch line RBL.

The branch line RBL extends in a horizontal direction, that is, the first direction x, and transmits a signal from the reference voltage line RL to the subpixels SP1 to SP4 arranged in the first direction. The branch line RBL is disposed on a different layer from the reference voltage line RL and is electrically connected to the reference voltage line RL through a first reference contact hole RH3. Unlike in the above-described first embodiment, the branch line RBL is not divided into two. At least a portion of the branch line RBL can be formed solely of a semiconductor layer. The branch line RBL can partially include a multi-layered structure including a semiconductor layer and the third metal layer formed on the semiconductor layer. The third metal layer can be made of any one selected from copper (Cu) and molybdenum titanium (MoTi) or can be a double-metal layer in which copper (Cu) and molybdenum titanium (MoTi) are stacked. The semiconductor layer has much higher light transmittance than a metal. The third metal layer is formed on the semiconductor layer between the first metal layer and the second metal layer.

A multi-layer portion of the branch line RBL, in which the semiconductor layer and the third metal layer are stacked (hereinafter, referred to as a "branch line having a multi-layered structure"), can be disposed in non-emission regions between the adjacent subpixels SP1, SP2, SP3, and SP4. The branch line having the multi-layered structure intersects the vertical lines such as the data lines DL1 to DL4.

A portion of the branch line RBL, in which only the semiconductor layer is present without the metal layer (hereinafter, referred to as a "single-layer branch line"), appears transparent. An oxide semiconductor (IGZO) has a light transmittance of 90% or more. The semiconductor layer of the single-layer branch line can be metalized to allow a current to flow. In the branch line having the multi-layered structure, the semiconductor layer below a metal can not be metalized but can be an amorphous semiconductor that is not metalized.

The single-layer branch line is connected to a pixel circuit across the emission region in at least one of the subpixels SP1 to SP4. The single-layer branch line can overlap an anode AND in the emission region. A portion of the semiconductor layer of the single-layer branch line can be bent in an "L" shape along the first and second directions in a region thereof overlapping the anode so as to be connected to at least one of the pixel circuits.

Due to the transparent single-layer branch line, an aperture ratio of the subpixel can be increased, and the emission region can be expanded. The aperture ratio of the subpixel is increased by as much as a region OA in which the transparent single-layer branch line overlaps the emission region of the subpixel SP. The emission region of the subpixel includes an exposed region of the anode AND defined by a bank BNK.

A gate electrode of the first switch element ST1 of the present disclosure is a portion of the gate line GL or is formed by being branched off from the gate line GL. A drain electrode of the first switch element ST1 is a portion of the data line DL or is formed by being branched off from the data line DL. An active layer of the first switch element ST1 is connected to the drain electrode thereof through a contact hole STH3 passing through a buffer layer BUF. A source electrode of the first switch element ST1 can be implemented using the second metal layer formed on the semiconductor layer. The first switch element ST1 can include an extension portion extending from the source electrode thereof. One side of the extension portion can be connected to the source electrode of the first switch element ST1, and the other side thereof can be connected to a gate electrode of the driving element DT. As shown in FIG. 2, the extension portion can connect the source electrode of the first switch element ST1 and the gate electrode of the driving element DT. Since the extension portion is continuous from the source electrode of the first switch element ST1, like the source electrode, the extension portion can have a multi-layered structure including a semiconductor layer and the second metal layer formed on the semiconductor layer.

The anode AND of a light-emitting element OLED disposed in an emission part EA of each of the subpixels SP1 to SP4 extends in the second direction and is electrically connected to a corresponding driving element DT and storage capacitor Cst in the circuit part CA.

Figure 9:
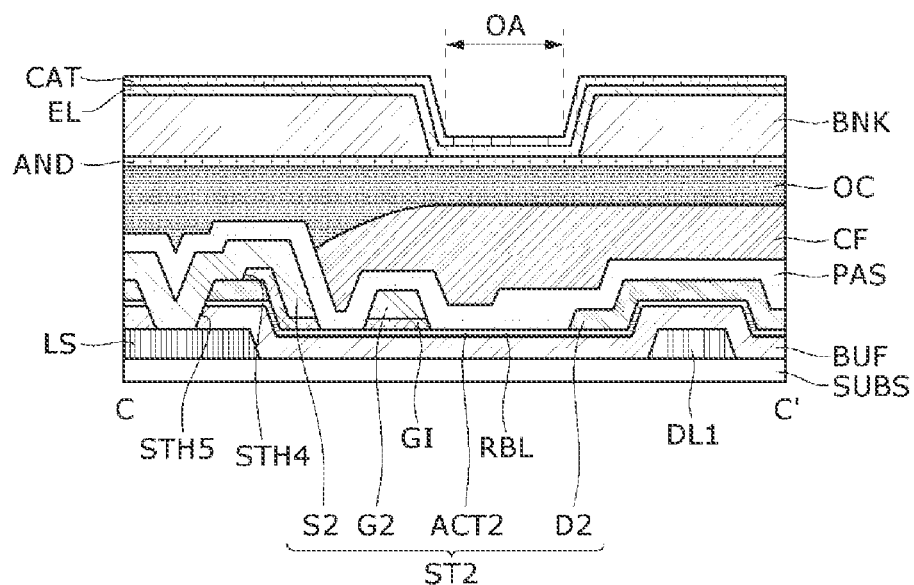
FIG. 9 is a cross-sectional view of the display panel taken along line C-C' in FIG. 8.
Figure 10:
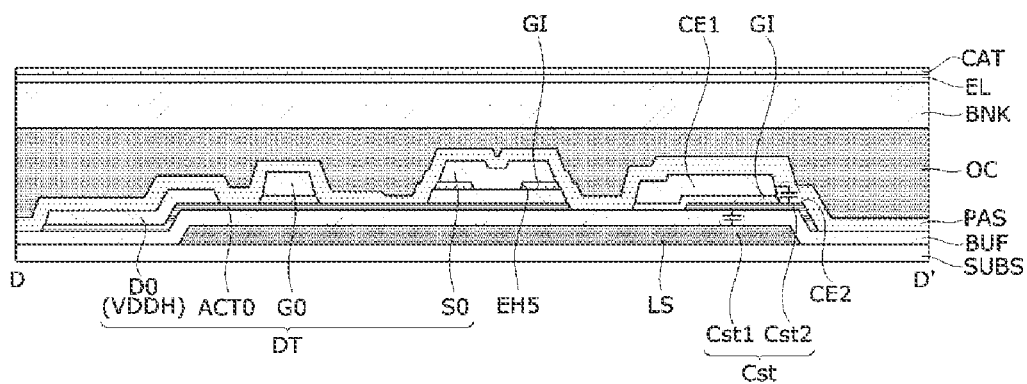
FIG. 10 is a cross-sectional view of the display panel taken along line D-D' in FIG. 8.

FIG. 9 is a cross-sectional view taken along line C-C' in the first subpixel SP1 in FIG. 8 which illustrates a cross-sectional structure of the second switch element ST2 and the branch line RBL shown in FIG. 8. FIG. 10 is a cross-sectional view taken along line D-D' in the first subpixel SP1 in FIG. 8 which illustrates a cross-sectional structure of the driving element DT, the storage capacitor Cst, and the horizontal power line VDDH shown in FIG. 8.

Referring to FIG. 9, the display panel 10 includes the first metal layer disposed on a substrate SUBS, the buffer layer BUF, the semiconductor layer, a first insulating layer GI, the second metal layer, a second insulating layer PAS, a third insulating layer OC, the anode AND, an organic compound layer EL, a cathode CAT, a color filter CF, and the bank BNK. The first metal layer includes the data line DL1 and a light-shield metal pattern LS at least. The second metal layer includes electrodes of the second switch element ST2. Each of the first and second metal layers can be implemented as a single-metal layer or a double-metal layer in which different types of metal layers are stacked. The semiconductor layer includes an active layer ACT2 of the second switch element ST2 and the branch line RBL at least. The third metal layer is partially stacked on the semiconductor layer. The third metal layer is formed on the semiconductor layer intersecting the data line DL1 to form a branch line having a multi-layered structure and can be used as source and drain electrodes of the second switch element ST2.

The data line DL1 and the light-shield metal pattern LS are disposed on the substrate SUBS. The data line DL1 can be made of the same first metal disposed on the same layer as the light-shield metal pattern LS. The light-shield metal pattern LS can be disposed only below a channel region (or active layer) of the driving element DT or can not be disposed only below the channel region of the driving element DT but also below channel regions of the first and second switch elements ST1 and ST2. The light-shield metal pattern LS can be used for the purpose of blocking external light or can be connected to electrodes of other transistors or lines and be used as an electrode of a capacitor.

The buffer layer BUF can be disposed on the substrate SUBS on which the data line DL1 and the light-shield metal pattern LS are disposed. The buffer layer BUF blocks ions or impurities diffused from the substrate SUBS and blocks permeation of external moisture.

The electrodes of the second switch element ST2 and the branch line RBL are disposed on the buffer layer BUF. The branch line RBL includes a branch line having a single-layered structure overlapping the emission region and a branch line having a multi-layered structure overlapping the data line DL1. In the branch line RBL, a semiconductor layer of the branch line having the single-layered structure overlapping the emission regions of the subpixels SP1 to SP4 is metalized so as to apply a reference voltage Vref applied to the reference voltage line RL to the pixel circuits of the subpixels SP1 to SP4.

Source and drain electrodes S2 and D2 of the second switch element ST2 can include the third metal layer formed on the semiconductor layer and the second metal layer in contact with the third metal layer on the third metal layer. A gate electrode of the second switch element ST2 can be formed of the second metal layer.

The second switch element ST2 includes the active layer ACT2, the gate electrode G2, the source electrode S2, and the drain electrode D2.

The active layer ACT2 is disposed on the buffer layer BUF. The active layer ACT2 can be divided into a channel region, a source region provided at one side of the channel region, and a drain region provided at the other side of the channel region.

The gate electrode G2 is formed of the second metal layer disposed on the channel region of the active layer ACT2 with the first insulating layer GI interposed therebetween. The first insulating layer GI can be formed as a silicon oxide (SiOx) film or a silicon nitride (SiNx) film, but the present disclosure is not limited thereto. The first insulating layer GI can be a gate insulating layer. The gate electrode G2 can be a portion of the gate line GL or can be a portion branched off from the gate line GL. That is, the gate electrode G2 and the gate line GL can be made of the same second metal on the same layer.

The source electrode S2 and the drain electrode D2 are disposed with the gate electrode G2 interposed therebetween on the buffer layer BUF. Therefore, the electrodes G2, S2, and D2 of the second switch element ST2 can be disposed substantially coplanar with each other on the buffer layer BUF.

The source electrode S2 includes the third metal layer formed on the source region of the semiconductor layer and the second metal layer in contact with the third metal layer on the third metal layer. Since the source electrode S2 is formed of the third metal layer, the source electrode S2 is connected to the active layer ACT2 formed of the semiconductor layer. The first insulating layer GI can be disposed between the source electrode S2 and the source region of the active layer ACT2. The second metal layer of the source electrode S2 is in contact with the third metal layer and the source region of the active layer ACT2 of the semiconductor layer through a contact hole STH4 passing through the first insulating layer GI. The second metal layer of the source electrode S2 is connected to the light-shield metal pattern LS through a contact hole STH5 passing through the first insulating layer GI, the semiconductor layer, and the buffer layer BUF. Although not shown in FIG. 9, as described above, the light-shield metal pattern LS can be connected to electrodes of other transistors or lines. The light-shield metal pattern LS connected to the source electrode S2 can connect the source electrode S2 to a source electrode of the driving element DT or the anode AND of the light-emitting element OLED.

The drain electrode D2 includes the third metal layer formed on the semiconductor layer including the active layer ACT2. The drain electrode D2 can further include the second metal layer in contact with the third metal layer on the third metal layer. The branch line RBL is formed of the third metal layer formed on the semiconductor layer and is connected to the drain electrode D2 as shown in FIG. 2. Accordingly, the branch line having the multi-layered structure of the branch line RBL and the drain electrode D2 are integrated into the third metal layer.

The second insulating layer PAS covers the second switch element ST2 and the branch line RBL. The second insulating layer PAS can be a passivation film. The passivation film can be an insulating layer which protects elements thereunder and can be a silicon oxide (SiOx) film, a silicon nitride (SiNx) film, or a multi-layer in which the silicon oxide (SiOx) film and the silicon nitride (SiNx) film are stacked.

The third insulating layer OC can be disposed on the second insulating layer PAS. The third insulating layer OC can be a planarization film for reducing a step difference of a structure thereunder and can be made of an organic material such as polyimide, a benzocyclobutene series resin, or acrylate. If necessary, any one of the passivation film and the planarization film can be omitted.

The color filter CF can be disposed between the second insulating layer PAS and the third insulating layer OC.

The light-emitting element OLED is disposed on the third insulating layer OC. The light-emitting element OLED includes the anode AND, the organic compound layer EL, and the cathode CAT which face each other.

The display device can be implemented as a bottom emission type. In this case, the anode AND can serve as a transparent electrode. As an example, the anode AND can be made of a transparent electrode material such as indium tin oxide (ITO), indium zinc oxide (IZO), or zinc oxide (ZnO).

The bank BNK is disposed on the substrate SUBS on which the anode AND is formed. The bank BNK can be made of an organic material such as polyimide, a benzocyclobutene series resin, or acrylate.

The organic compound layer EL of the light-emitting element OLED is disposed on the substrate SUBS on which the bank BNK is formed. The organic compound layer EL can include an emission layer EML which is a layer in which electrons and holes are combined to emit light and can include one or more of an HIL, an HTL, an ETL, and an EIL.

The cathode CAT is disposed on the organic compound layer EL. The cathode CAT can be widely formed on an entire surface of the substrate SUBS. Since the display device according to the second embodiment of the present disclosure is implemented as a bottom emission type, the cathode CAT can serve as a reflective electrode. For example, the cathode CAT can be made of a reflective material having a low work function, such as magnesium (Mg), calcium (Ca), aluminum (Al), silver (Ag), or an alloy thereof.

As can be seen from an overlapping region OA shown in FIG. 9, the transparent branch line having the single-layered structure of the branch line RBL overlaps the emission regions of the subpixels SP1 and SP2. As a result, according to the present disclosure, the emission regions of the subpixels SP1 to SP4 can be wider to increase luminance and reduce power consumption.

Referring to FIG. 10, the display panel 10 includes the first metal layer disposed on the substrate SUBS, the buffer layer BUF, the semiconductor layer, the first insulating layer GI, the second metal layer, the second insulating layer PAS, the third insulating layer OC, the anode AND, the organic compound layer EL, the cathode CAT, the color filter CF, and the bank BNK. The first metal layer includes the light-shield metal pattern LS. The second metal layer can be used as the gate electrode of the driving element DT and an upper electrode CE1 of the storage capacitor Cst. Each of the first and second metal layers can be implemented as a single-metal layer or a double-metal layer in which different types of metal layers are stacked. The semiconductor layer includes an active layer ACT0 of the driving element DT at least. The third metal layer is partially stacked on the semiconductor layer. The third metal layer can be formed on the semiconductor layer and patterned into the horizontal power line VDDH and can be used as the source and drain electrodes of the driving element DT. The source and drain electrodes of the driving element DT can further include the second metal layer in contact with the third metal layer on the third metal layer.

The light-shield metal pattern LS is disposed on the substrate SUBS. The buffer layer BUF can be disposed on the substrate SUBS on which the light-shield metal pattern LS is disposed. The driving element DT and the horizontal power line VDDH are formed on the buffer layer BUF.

The driving element DT includes the active layer ACT0, a gate electrode G0, a source electrode S0, and a drain electrode D0.

The active layer ACT0 is formed of a non-metalized semiconductor layer disposed on the buffer layer BUF. The active layer ACT0 can be divided into a channel region, a source region provided at one side of the channel region, and a drain region provided at the other side of the channel region.

The gate electrode G0 is disposed on the channel region of the active layer ACT0 with the first insulating layer GI interposed therebetween. The first insulating layer GI can be formed as a silicon oxide (SiOx) film or a silicon nitride (SiNx) film, but the present disclosure is not limited thereto. Here, the first insulating layer GI can be a gate insulating layer. The gate electrode G0 can be disposed between the source electrode S0 and the drain electrode D0.

The source electrode S0 and the drain electrode D0 can be disposed with the gate electrode G0 interposed therebetween on the buffer layer BUF.

The first insulating layer GI can be disposed between the source electrode S0 and the buffer layer BUF. The source electrode S0 can include the same second metal layer on the same layer as the gate electrode G0. The second metal layer of the source electrode S0 can be connected to the third metal layer formed in the source region of the active layer ACT0 through a source contact hole EH5 passing through the first insulating layer GI. As shown in FIG. 8, the source electrode S0 can be connected to the anode AND of the light-emitting element OLED through a contact hole CH2.

The drain electrode D0 can include a semiconductor layer formed in the drain region of the active layer ACT0 and the third metal layer formed on the semiconductor layer. The drain electrode D0 can further include the second metal layer formed on the third metal layer and in contact with the third metal layer. The drain electrode D0 can be a portion of the horizontal power line VDDH or can be a portion branched off from the horizontal power line VDDH. Thus, the horizontal power line VDDH can be integrated with the drain electrode D0. Accordingly, the drain electrode D0 and the horizontal power line VDDH can share the semiconductor layer and the third metal layer formed thereon.

In FIG. 10, the storage capacitor Cst includes first and second capacitors Cst1 and Cst2 and thus has a larger capacity than that of the first embodiment. As shown in FIG. 2, the storage capacitor Cst is connected between the gate electrode G0 and the source electrode S0 of the driving element DT.

The first capacitor Cst1 includes the light-shield metal pattern LS and an intermediate electrode CE2 which are opposite to each other with the buffer layer BUF interposed therebetween. The light-shield metal pattern LS is integrated with a lower electrode of the storage capacitor Cst. The intermediate electrode CE2 includes a metalized semiconductor layer connected to the active layer ACT0. The intermediate electrode CE2 can further include the third metal layer formed on the semiconductor layer.

The second capacitor Cst2 includes the intermediate electrode CE2 and the upper electrode CE1 which are opposite to each other with the first insulating layer GI interposed therebetween. The upper electrode CE1 can be formed of the same second metal layer as the gate electrode G0 on the first insulating layer GI.

As shown in FIG. 10, according to the present disclosure, a double-capacitor is formed in the pixel circuit of each of the subpixels SP1 to SP4, thereby securing sufficient capacitor capacity. As a result, the size of the storage capacitor Cst can be reduced, thereby expanding the emission regions of the subpixels SP1 to SP4 and increasing an aperture ratio.

The second insulating layer PAS covers the driving element DT, the horizontal power line VDDH, and the storage capacitor Cst. The second insulating layer PAS can be a passivation film. The passivation film can be an insulating layer which protects elements thereunder and can be a silicon oxide (SiOx) film, a silicon nitride (SiNx) film, or a multi-layer in which the silicon oxide (SiOx) film and the silicon nitride (SiNx) film are stacked.

The third insulating layer OC can be disposed on the second insulating layer PAS. The third insulating layer OC can be a planarization film for reducing a step difference of a structure thereunder and can be made of an organic material such as polyimide, a benzocyclobutene series resin, or acrylate. If necessary, any one of the passivation film and the planarization film can be omitted.

The light-emitting element OLED is disposed on the third insulating layer OC. The light-emitting element OLED includes the anode AND, the organic compound layer EL, and the cathode CAT. The anode AND is not visible in a cross section taken along line D-D'.

In one photo process, in the display panel shown in FIGS. 8 to 10, the third metal layer can be partially stacked on the semiconductor layer, and the semiconductor layer can be partially metalized. In the photo process, after the semiconductor layer and the third metal layer are consecutively deposited on the buffer layer BUF, a half-tone mask is used. This photo process will be described in conjunction with FIGS. 11A to 11E.

FIGS. 11A to 11E are views illustrating a photo process of simultaneously forming patterns of a third metal layer on a semiconductor layer using a halftone mask and partially metalizing the semiconductor layer.

Figure 11A:
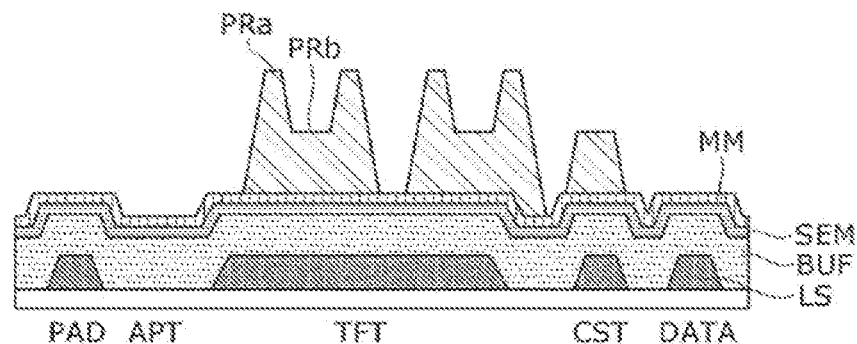
FIGS. 11A to 11E are views illustrating a photo process of simultaneously forming patterns of a third metal layer on a semiconductor layer using a halftone mask and partially metalizing the semiconductor layer according to an example of the present disclosure.

Referring to FIG. 11A, in the photo process, a semiconductor layer SEM is entirely deposited on a buffer layer BUF, and a metal layer MM is deposited thereon. A material of the semiconductor layer SEM can be selected from an oxide semiconductor that is easily metalized, for example, IGZO. The metal layer MM can be made of any one selected from copper (Cu) and molybdenum titanium (MoTi) or can be a double-metal layer in which copper (Cu) and molybdenum titanium (MoTi) are stacked. The metal layer MM is used as the above-described third metal layer.

A photosensitive material is applied on the metal layer MM to form a photosensitive material layer on the metal layer MM. In the photo process, a halftone mask imprinted with a desired pattern is aligned on the photosensitive material layer, and the photosensitive material layer is exposed and developed through the halftone mask to pattern the photosensitive material layer. As a result, photoresist patterns PRa and PRb remain on the metal layer MM.

The halftone mask can include a transmissive portion, a semi-transmissive portion, and a blocking portion according to light transmittance. In the halftone mask, the photosensitive material exposed to light incident through the transmissive portion can be completely removed by a developer, and an upper end portion of the photosensitive material exposed to light incident through the semi-transmissive portion can be partially removed by the developer. The first photoresist pattern PRa is an unexposed portion and is relatively thick. The second photoresist pattern PRb corresponds to the photosensitive material exposed through the semi-transmissive portion of the halftone mask. The second photoresist pattern PRb is thinner than the first photoresist pattern PRa. The first photoresist pattern PRa is positioned on a portion remaining as a structure in which the semiconductor layer and the third metal layer are stacked. The second photoresist pattern PRb is positioned on a portion in which only the semiconductor layer remains without the third metal layer. In a portion in which the photoresist patterns PRa and PRb are not present, both the semiconductor layer and the third metal layer are removed in an etching process.

Figure 11B:
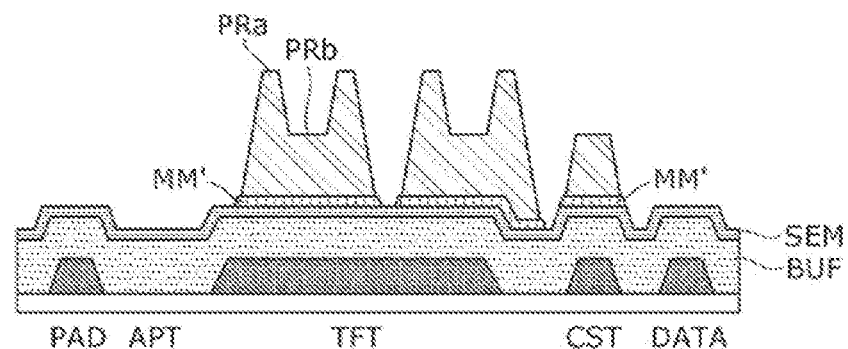

Subsequently, in the photo process, wet etching is performed by spraying an etchant on the metal layer MM. As a result, as shown in FIG. 11B, a portion of the metal layer MM, which is covered by the first and second photoresist patterns PRa and PRb, remains on the semiconductor layer SEM, and the remaining portion of the metal layer MM, which is exposed to the etchant, is removed. A width of a metal pattern MM' remaining on the semiconductor layer SEM can be less than that of the photoresist patterns PRa and PRa due to the metal layer being over-etched.

Figure 11C:
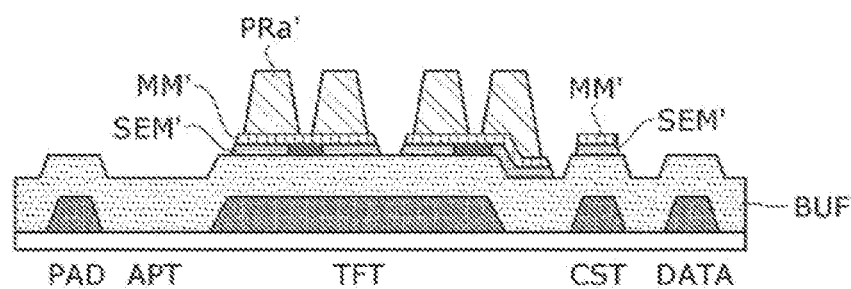

Subsequently, in the photo process, the thicknesses of the photoresist patterns PRa and PRb are adjusted through an ashing process. Through the ashing process, the thickness of the first photoresist pattern PRa is reduced, and the second photoresist pattern PRb is completely etched and removed. As a result, as shown in FIG. 11C, after the ashing process, a first photoresist pattern PRa', of which a thickness is reduced, remains on the semiconductor layer SEM.

Next, in the photo process, wet etching is performed on the semiconductor layer SEM. As a result, the semiconductor layer SEM below the first photoresist pattern PRa' remains on the buffer layer BUF, and the semiconductor layer SEM exposed to the etchant is removed.

Figure 11D:
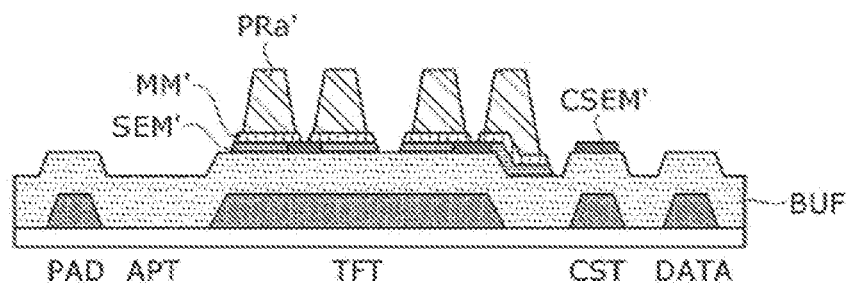

After that, plasma treatment is performed to metalize a semiconductor pattern SEM' which is exposed without being covered by a photoresist pattern PRa'. As a result, as shown in FIG. 11D, the metalized semiconductor pattern SEM', which is used as an intermediate electrode CE2 of a storage capacitor Cst, can be formed on the buffer layer BUF.

Figure 11E:
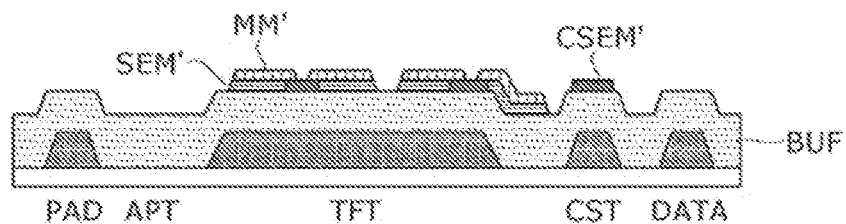

Further, the semiconductor pattern can be metalized in contact holes through which the semiconductor pattern and an electrode of a transistor or a line are connected. After the semiconductor pattern is metalized, as shown in FIG. 11E, the photoresist pattern PRa' is removed.

Figure 12A:
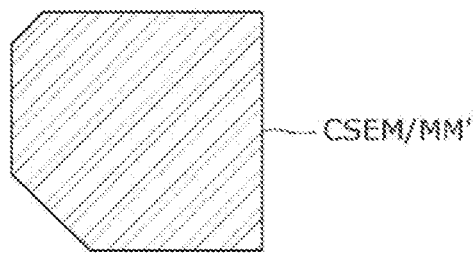
FIGS. 12A to 12C are plan views illustrating a contact hole structure of a pixel circuit shown in FIG. 8.
Figure 12B:
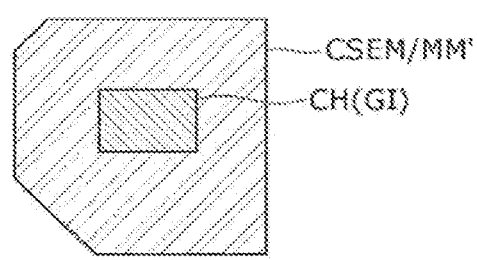
Figure 12C:
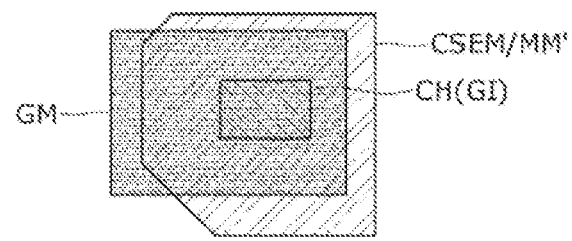

FIGS. 12A to 12C are plan views illustrating a contact hole structure of the pixel circuit shown in FIG. 8. In FIGS. 12A to 12C, reference symbol "GM" represents a partial pattern of a second metal layer used as electrodes of transistors DT, ST1, and ST2. The contact hole structure shown in FIGS. 12A to 12C can be any one of the contact holes CH2, STH3, and STH4 in FIG. 8, through which the semiconductor layer and the second metal layer are connected.

For example, a source electrode S0 of a driving element DT is connected to a branch line RBL through the contact hole STH4 passing through a first insulating layer GI. In the contact hole STH4, a metalized semiconductor layer of the branch line RBL can be connected to a second metal layer connected to the source electrode S0. As another example, in the contact hole STH4, a third metal layer of the branch line RBL can be connected to the source electrode S0 of the driving element DT.

After the first insulating layer GI is formed on a metalized semiconductor pattern CSEM/MM', the first insulating layer GI is etched. As a result, as shown in FIGS. 12A and 12B, a portion of the metalized semiconductor pattern CSEM/MM' is exposed through a contact hole CH(GI) from which the first insulating layer GI is removed.

The second metal layer GM can be in contact with a metal pattern MM' formed on a non-metalized semiconductor layer SEM in the contact hole CH(GI). In this case, the first insulating layer GI is etched so that the metal pattern MM' on the semiconductor layer SEM is exposed in the contact hole CH(GI).

Subsequently, as shown in FIG. 12C, the second metal layer GM is formed on the first insulating layer GI so that the contact hole CH(GI) is completely covered. The second metal layer GM can be a source electrode, a drain electrode, or a gate electrode of the transistors DT, ST1, and ST2. As shown in FIG. 12C, the second metal layer GM is in contact with the metalized semiconductor layer CSEM or the metal pattern MM' in the contact hole CH(GI).

In the contact hole structure shown in FIG. 12C, since the second metal layer GM is in contact with the metal layer MM' having low resistance or the metalized semiconductor layer CSEM, a separate semiconductor conductor metalizing process is not required. In the contact hole structure shown in FIG. 7D, since the semiconductor layer overlapping the second metal layer cannot be metalized, electrical resistance can be increased. In order to reduce the resistance, in FIGS. 7A to 7D, the contact hole exposing the semiconductor layer can be enlarged to increase an exposed region of the semiconductor layer to metalize the semiconductor, but only a portion of the contact hole can be used as an actual contact region.

In the contact hole structure shown in FIG. 12C, since the metalized semiconductor pattern CSEM or the third metal pattern MM' on the semiconductor layer is in contact with the second metal layer GM, a resistance of the contact hole can be reduced without needing to take into account that it is difficult to metalize the semiconductor layer overlapping the second metal layer GM. Therefore, according to the present disclosure, the size of the contact hole CH(GI) can be reduced using the contact hole structure shown in FIG. 12C, thereby reducing areas of pixel circuits of subpixels SP1 to SP4. As a result, according to the present disclosure, emission regions of the subpixels SP1 to SP4 can be further increased, and an aperture ratio can be increased. Furthermore, according to the present disclosure, as can be seen from FIG. 8, the number of the contact holes STH4 connecting the branch line RBL and the switch element ST2 can be reduced to one, thereby further reducing the area of the pixel circuit and further increasing the aperture ratio.

Figure 13:
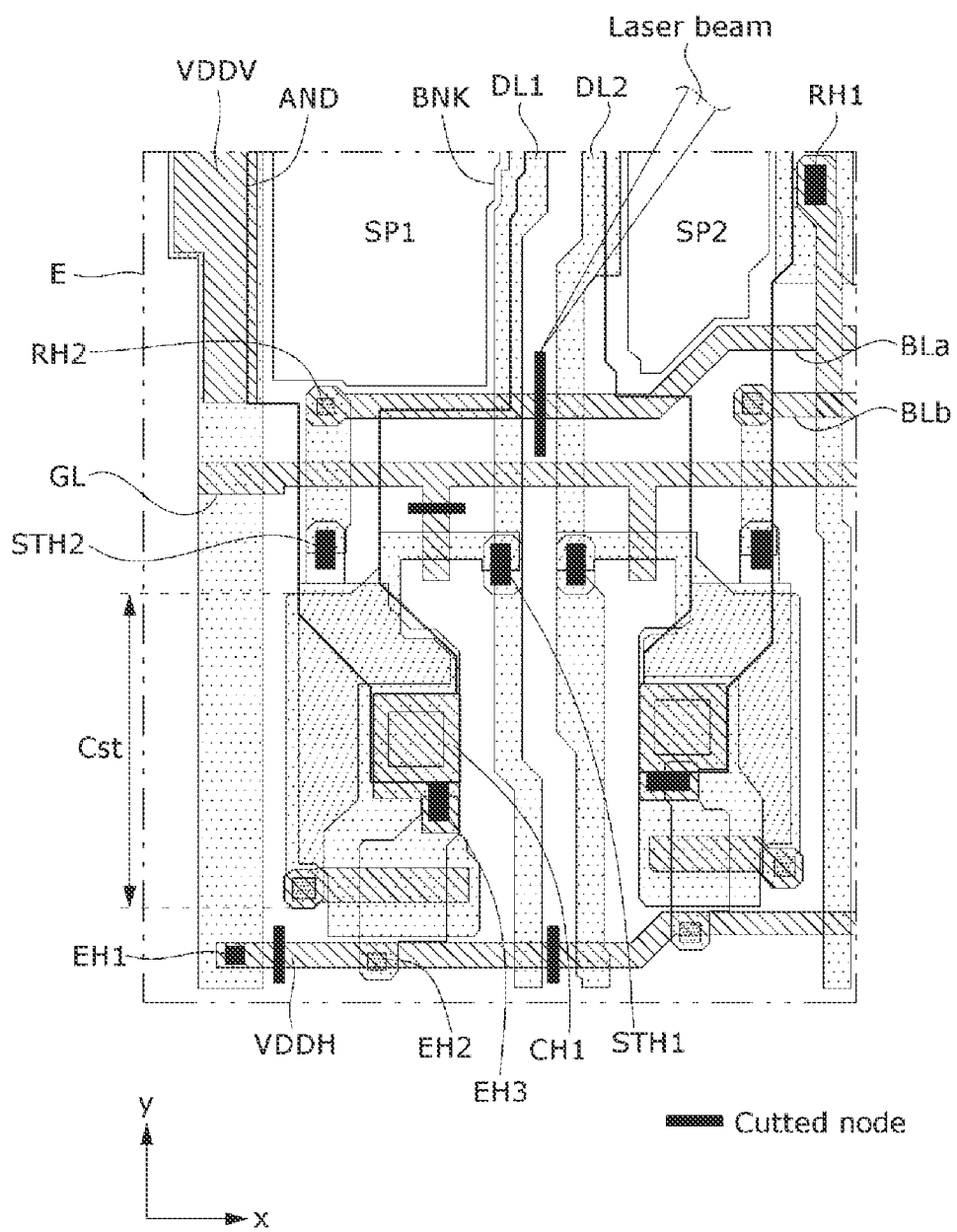
FIG. 13 is an enlarged plan view of region E in FIG. 3.
Figure 14:
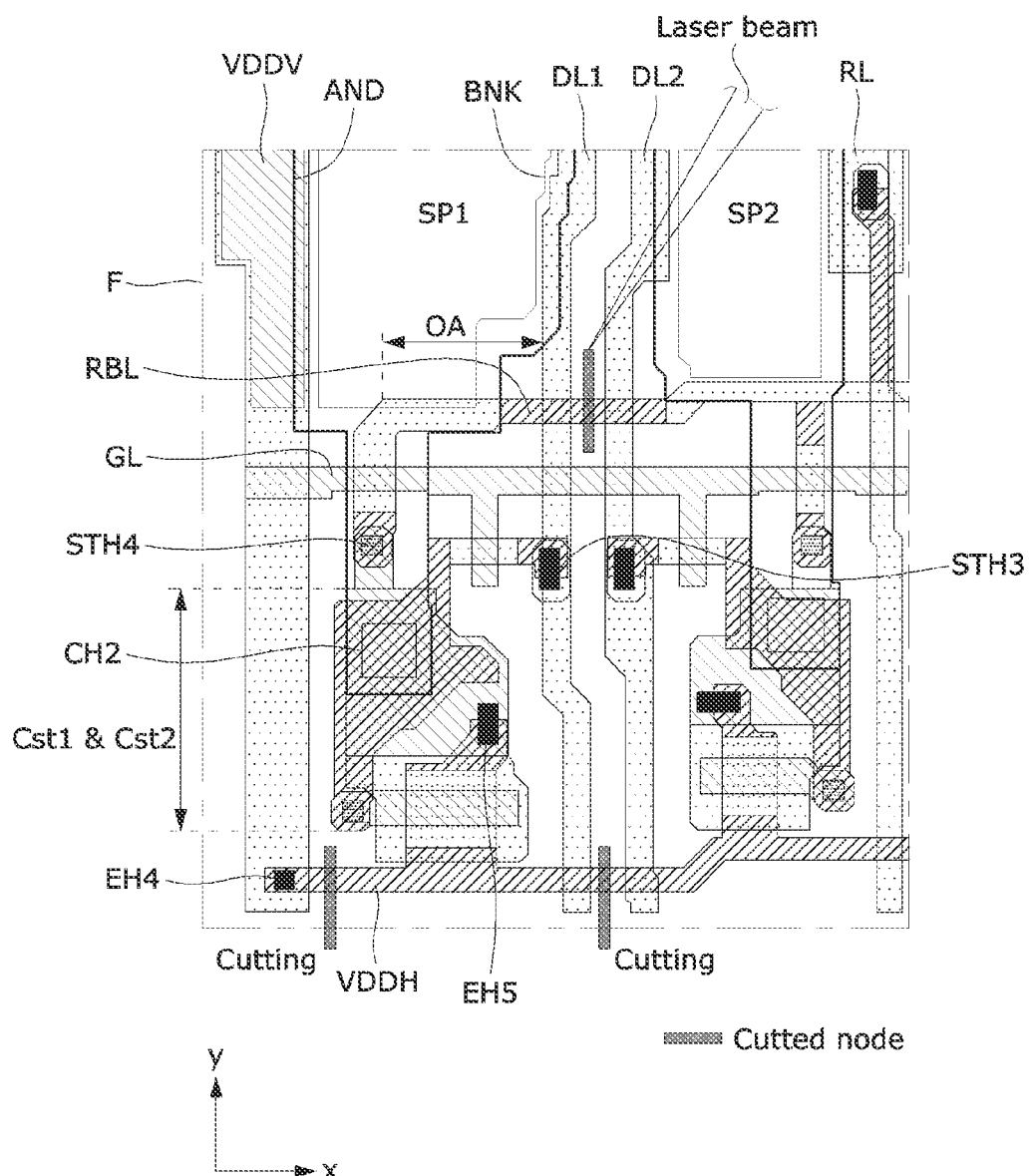
FIG. 14 is an enlarged plan view of region F in FIG. 8.

FIGS. 13 and 14 are views illustrating examples of darkening a defective subpixel through laser cutting in a repair process.

FIG. 13 is an enlarged plan view of region E in FIG. 3. FIG. 14 is an enlarged plan view of region F in FIG. 8.

After a pixel array of a display panel is completed, a test process is performed. A defective subpixel can be found on a screen of the display panel. In this case, in the repair process, a laser beam can be irradiated onto lines of some nodes (cutted node) or electrodes of a pixel circuit in the pixel circuit of the defective subpixel to block a current path, thereby darkening the defective subpixel. The darkening of the defective subpixel can minimize visibility of the defective subpixel to a user. FIGS. 13 and 14 illustrate an example in which a first subpixel is a defective subpixel.

Referring to FIG. 13, a repair process includes irradiating a laser beam onto metals of a branch line RBL and a horizontal power line VDDH, which supply power (Vref or EVDD) to a pixel circuit, in order to darken a defective subpixel. A metal line can be melted and disconnected using a laser beam having a wavelength of 1,064 nm generated in a general laser device. When the horizontal power line VDDH has a multi-layered structure in which a semiconductor layer and a third metal layer are stacked, the third metal layer of the horizontal power line VDDH can be melted to disconnect the horizontal power line VDDH without changing the wavelength of the laser beam. Since the semiconductor layer below the third metal layer is not metalized, when the third metal layer is disconnected, the horizontal power line VDDH can be disconnected.

The repair process can further include disconnecting a gate electrode of a first switch element ST1 using the laser beam without changing the wavelength of the laser beam.

In the display panel shown in FIG. 8, the branch line RBL includes a semiconductor layer and a metal layer partially formed on the semiconductor layer. Since the semiconductor layer is not melted using the laser beam having the wavelength of 1,064 nm, an additional laser device is required. For example, an oxide semiconductor (IGZO) can be melted using a laser beam having a wavelength of 266 nm. Accordingly, in the case of the display panel shown in FIG. 8, in order to reduce costs of the repair process, as shown in FIG. 14, the branch line RBL can be disconnected by irradiating the laser beam having the wavelength of 1,064 nm onto the third metal layer formed on the semiconductor layer in a branch line having the multi-layered structure.

In the branch line having the multi-layered structure, the semiconductor layer below the third metal layer is a non-metalized portion, and the branch line having the multi-layered structure can intersect data lines between the adjacent pixel circuits. Accordingly, when the third metal layer of the branch line having the multilayered structure is disconnected, a current path to which a reference voltage Vref is applied can be blocked.

Figure 15:
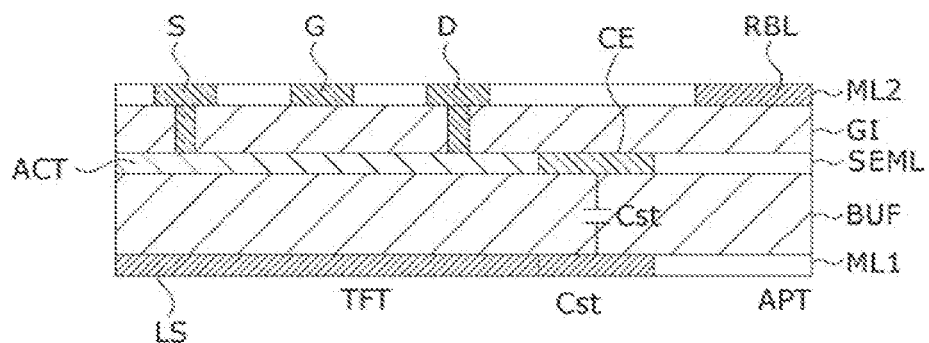
FIGS. 15 to 17 are schematic cross-sectional views illustrating a cross-sectional structure of a display panel according to various embodiments of the present disclosure.
Figure 16:
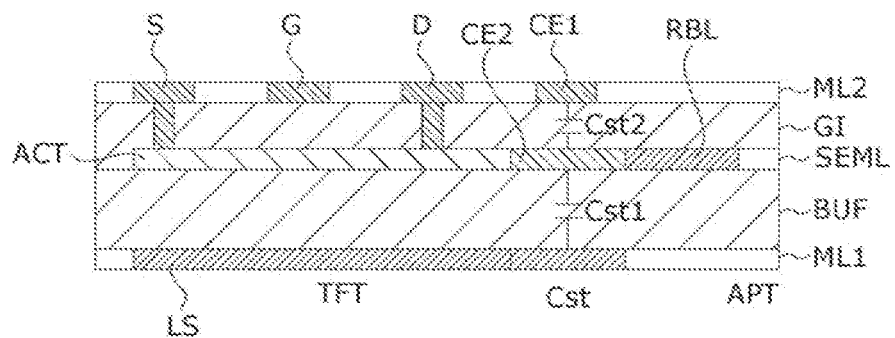
Figure 17:
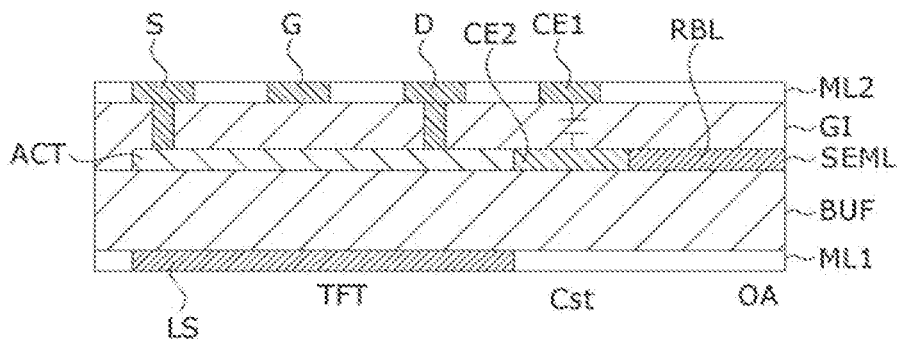

FIGS. 15 to 17 are schematic cross-sectional views illustrating a cross-sectional structure of a display panel 10 according to various embodiments of the present disclosure As can be seen from FIGS. 15 to 17, cross-sectional structures of pixel circuits of the present disclosure each include a first metal layer ML1 formed on a substrate, a buffer layer BUF configured to cover the first metal layer, an insulating layer GI formed on the buffer layer BUF to cover a semiconductor layer SEML of a transistor TFT, and a second metal layer ML2 formed on the insulating layer GI.

The first metal layer ML1 includes a light-shield metal layer LS of the transistor TFT and a lower electrode of a capacitor Cst. The second metal layer ML2 includes a gate electrode G, a source electrode S, and a drain electrode D of the transistor, which are disposed substantially coplanar with each other. The semiconductor layer SEML includes an active layer ACT forming a channel of the transistor TFT. The transistor TFT can be a driving element DT or a switch element ST1 or ST2 and can be any transistor of the pixel circuit.

As shown in FIGS. 16 and 17, at least a portion of a branch line RBL can include a metalized semiconductor layer disposed substantially coplanar with the semiconductor layer SEML.

In the display panel 10 shown in FIG. 3, the cross-sectional structure of the transistor TFT, the storage capacitor Cst, and the branch line RBL can be simply expressed as shown in FIG. 15. The transistor TFT shown in FIG. 15 is the driving element DT. The switch elements ST1 and ST2 have substantially the same structure as the driving element DT, except that the light-shield metal pattern LS can not be present.

Referring to FIG. 15, the gate electrode G, the source electrode S, and the drain electrode D of the transistor TFT of the pixel circuit can be formed of metal patterns divided from the second metal layer ML2 disposed on the first insulating layer GI. The transistor TFT can be any transistor constituting the pixel circuit, that is, each of the driving element and the switch element. The transistor TFT includes the active layer ACT formed on the buffer layer BUF. The active layer ACT can be formed of a semiconductor pattern divided from the semiconductor layer SEML between the buffer layer BUF and the first insulating layer GI. Each of the buffer layer BUF and the first insulating layer GI can be an inorganic insulating film.

The light-shield metal pattern LS divided from the first metal layer ML1 can be disposed below the transistor TFT. The light-shield metal pattern LS can be patterned from the first metal layer covered by the buffer layer BUF. The storage capacitor Cst includes an upper electrode CE formed of a metalized semiconductor pattern and a lower electrode formed of the first metal layer ML1. The light-shield metal pattern LS and the lower electrode of the storage capacitor Cst can be integrated into a single pattern of the first metal layer ML1. The branch line RBL includes first and second branch lines BLa and BLb patterned from the second metal layer ML2.

Accordingly, in the display panel 10 shown in FIG. 15, the first metal layer ML1 includes the light-shield metal pattern LS of the transistor TFT and the lower electrode of the storage capacitor Cst at least. The semiconductor layer SEML includes the active layer ACT of the transistor TFT and the upper electrode CE of the storage capacitor Cst at least. The second metal layer ML2 includes the electrodes of the transistor TFT and the branch lines BLa and BLb (i.e., the RBL in FIG. 15) at least.

In the display panel 10 shown in FIG. 8, the cross-sectional structure of the transistor TFT, the storage capacitor Cst, and the branch line RBL can be simply expressed as shown in FIG. 16. The storage capacitor Cst can be implemented in the structure shown in FIG. 17.

Referring to FIGS. 16 and 17, the first metal layer ML1 includes the light-shield metal pattern LS of the transistor TFT at least. The first metal layer ML1 can further include the lower electrode of the storage capacitor Cst. The semiconductor layer SEML includes the active layer ACT of the transistor TFT, an intermediate electrode CE2 of the storage capacitor Cst, and the branch line RBL at least. The second metal layer ML2 includes the electrodes of the transistor TFT and the upper electrode CE1 of the storage capacitor Cst at least.

The intermediate electrode CE2 of the storage capacitor Cst shown in FIG. 16 is implemented using a metalized semiconductor layer. As shown in FIG. 16, the storage capacitor Cst can include a first capacitor Cst1 between the first metal layer ML1 and the semiconductor layer SEML and a second capacitor Cst2 between the semiconductor layer SEML and the second metal layer ML2. As another embodiment, as shown in FIG. 17, the storage capacitor Cst can be implemented as a capacitor between the semiconductor layer SEML and the second metal layer ML2.

When the semiconductor layer SEML is a single-layered semiconductor layer, the semiconductor layer SEML can be partially metalized. A third metal layer omitted in the drawing can be formed on the semiconductor layer SEML. The third metal layer is disposed on the semiconductor layer SEML between the first metal layer ML1 and the second metal layer ML2.

The branch line RBL includes a single-layered branch line overlapping an emission region of an opening APT. Since the single-layered branch line is formed of a transparent metalized semiconductor layer, the single-layered branch line can overlap the emission region to enlarge the opening.

Figure 18:
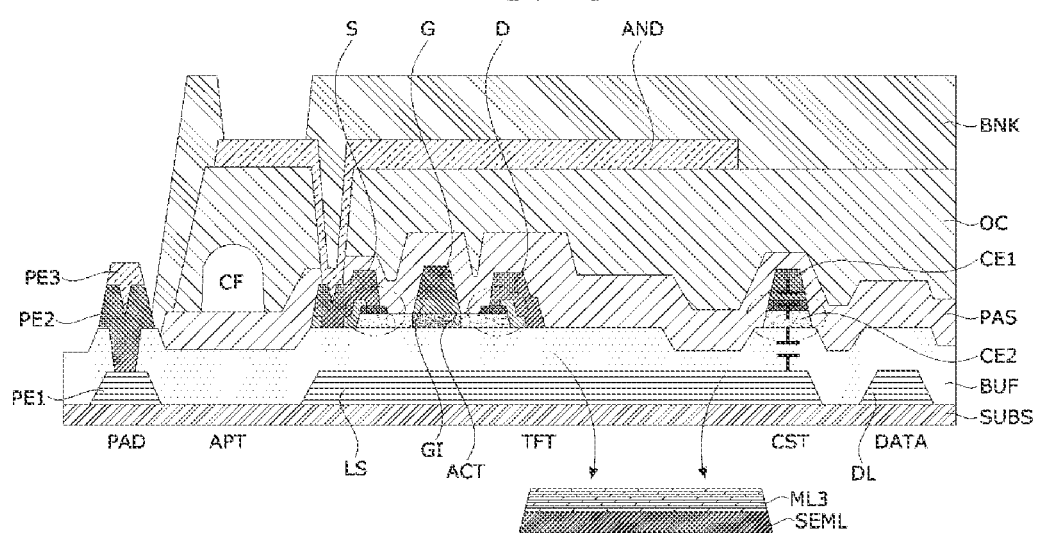
FIG. 18 is a cross-sectional view illustrating a stacked structure of a semiconductor layer and a metal layer connected to electrodes of a transistor and electrodes of a storage capacitor according to an example of the present disclosure.

In the display panel shown in FIG. 8, the electrodes of the transistor and the electrodes of the storage capacitor can be connected to a stacked structure of a semiconductor layer and a metal layer as shown in FIG. 18.

Referring to FIG. 18, an active layer ACT of a transistor TFT can have a multi-layered structure in which a semiconductor layer SEML and a third metal layer ML3 are stacked. Source and drain electrodes S and D of the transistor TFT are in contact with the third metal layer ML3 on the semiconductor layer SEML through a contact hole passing through a first insulating layer GI.

An intermediate electrode CE2 of a storage capacitor Cst can have a multi-layered structure in which the semiconductor layer SEML and the third metal layer ML3 are stacked. In this case, the semiconductor layer SEML of the intermediate electrode CE2 does not need to be metalized.

A pad PAD can include a first electrode PE1 formed of a first metal layer ML1, a second electrode PE2 formed of a second metal layer ML2, and a third electrode PE3 formed on the second electrode PE2. The second electrode PE2 is in contact with the first electrode PE1 through a contact hole passing through a buffer layer BUF. The third electrode PE3 is made of the same transparent electrode material as an anode AND of a light-emitting element OLED concurrently with the anode AND. An output pin of a source driver 12 is connected to the third electrode PE3 of the pad PAD through an anisotropic conductive film (ACF).

Figure 19:
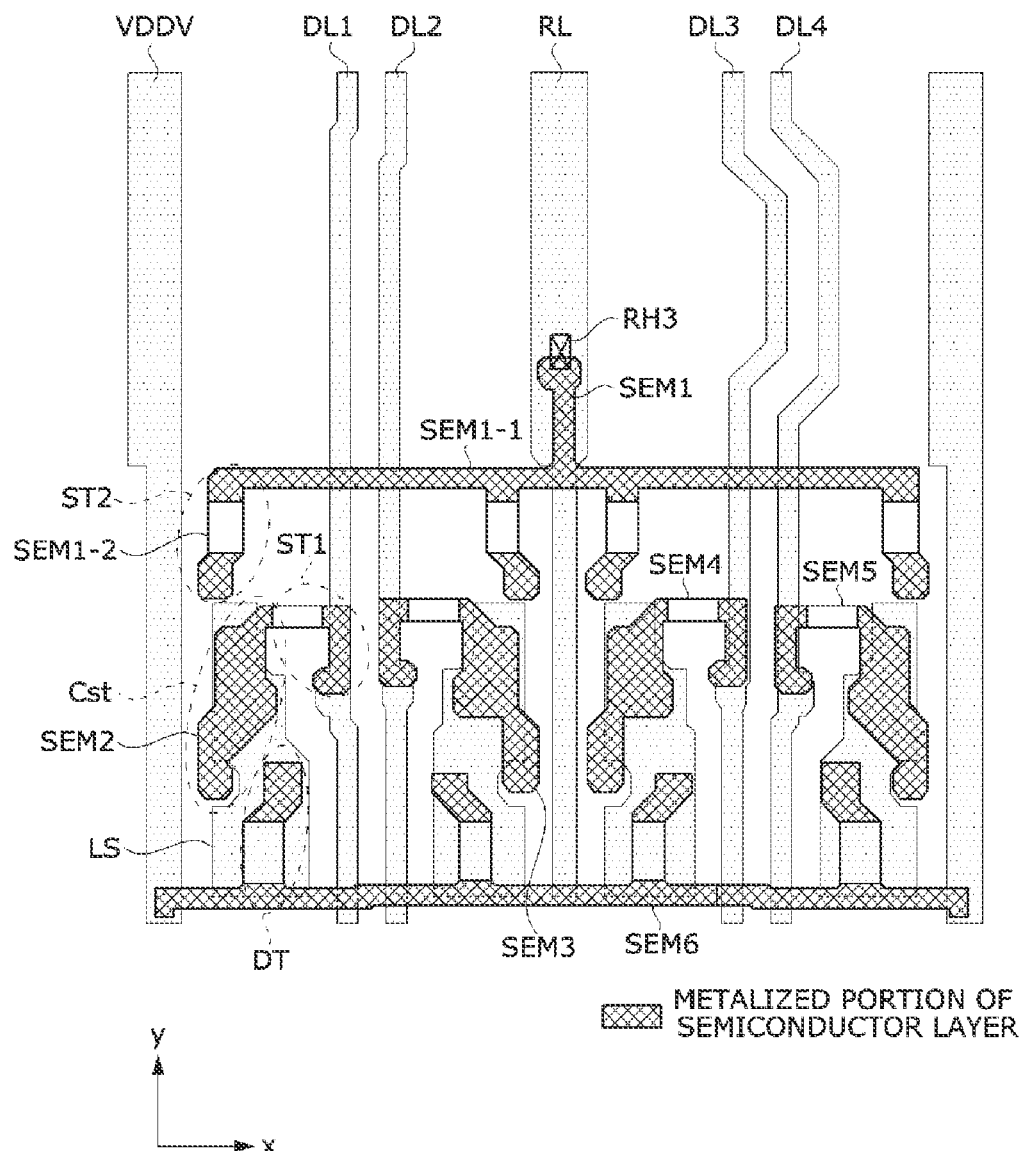
FIG. 19 is a plan view illustrating a pattern of a first metal layer and a pattern of a semiconductor layer in the display panel shown in FIG. 8 in detail.

In the display panel 10 shown in FIG. 8, a pattern of the first metal layer and a semiconductor pattern are the same as those of FIG. 19.

Referring to FIG. 19, a pattern of a first metal layer ML includes a vertical power line VDDV, a reference voltage line RL, data lines DL1 to DL4, and a light-shield metal pattern LS at least.

A semiconductor pattern includes first to sixth semiconductor patterns SEM1 to SEM6 at least. The first semiconductor pattern SEM1 includes a branch line connected to a reference voltage line RL through a contact hole RH3.

A semiconductor pattern of a branch line RBL includes a metalized line portion SEM1-1 which crosses an emission region of at least one of subpixels in a first direction x and a branch portion SEM1-2 which is bent from the line portion SEM1-1 in a second direction y intersecting the first direction x and is connected to the pixel circuit.

The line portion SEM1-1 of the branch line RBL can cross the emission regions of one or more subpixels and overlap the emission regions. A plurality of branch portions SEM1-2 can be connected to one line portion SEM1-1 so that a reference voltage Vref can be applied to one or more subpixels through the branch line RBL. The branch portion SEM1-2 can include a non-metalized active layer of a second switch element ST2 and at least one electrode of electrodes of the second switch element ST2. The branch portion SEM1-2 can include a metalized electrode portion in contact with source and drain electrodes of a second switch element ST2.

Portions of each of the second to fifth semiconductor patterns SEM2 to SEM5, which are in contact with an electrode of a storage capacitor Cst and source and drain electrodes of a first switch element ST1, can be metalized. The portions of the second semiconductor pattern SEM2, which are in contact with the electrode of the storage capacitor Cst and the source and drain electrodes of the first switch element ST1, can be metalized. The sixth semiconductor pattern SEM6 can be metalized at source and drain electrodes of a driving element DT.

Figure 20:
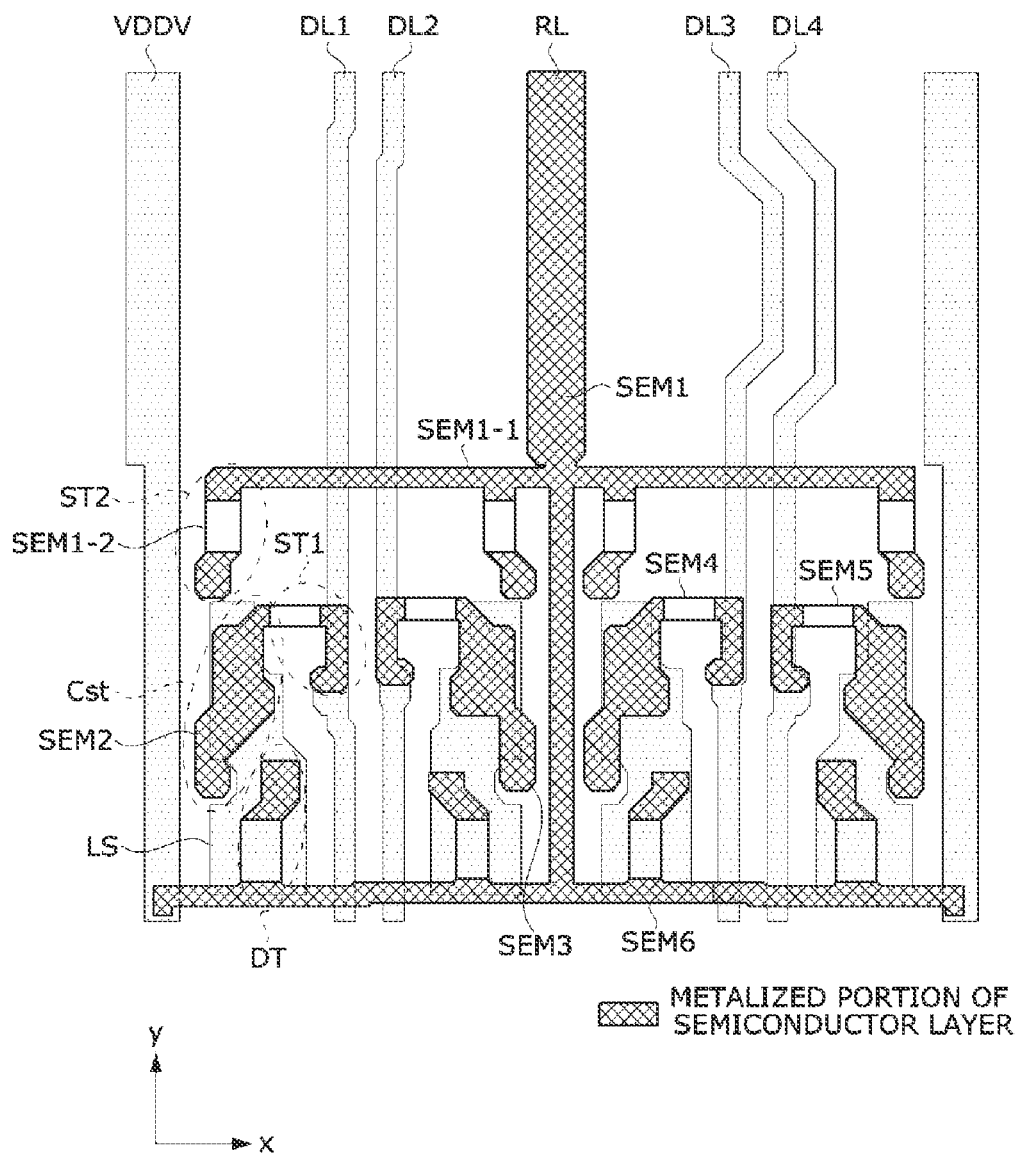
FIG. 20 is a plan view illustrating an example in which a reference voltage line and a branch pattern are connected directly to a metalized semiconductor pattern according to an example of the present disclosure.
Figure 21A:
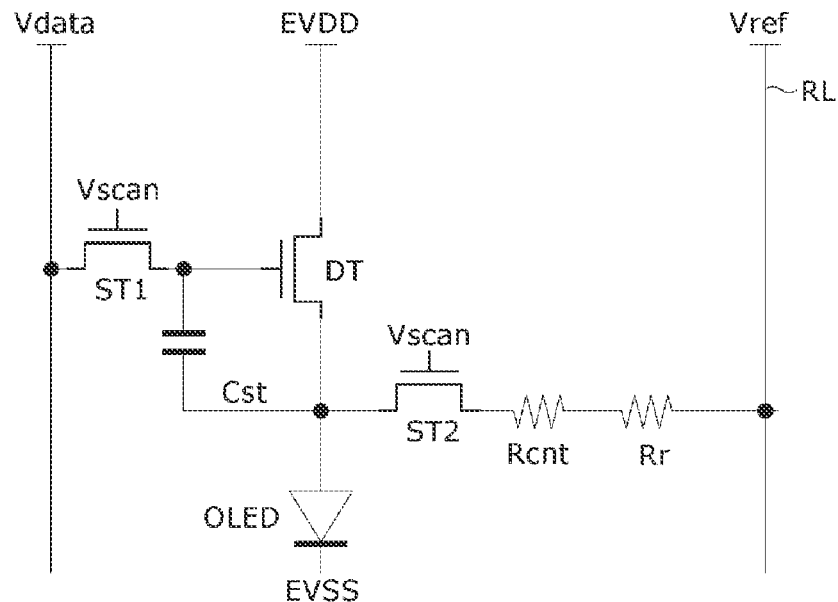
FIGS. 21A and 21B are circuit diagrams illustrating the presence or absence of a contact hole resistance between a reference voltage line and a branch line according to an example of the present disclosure.
Figure 21B:
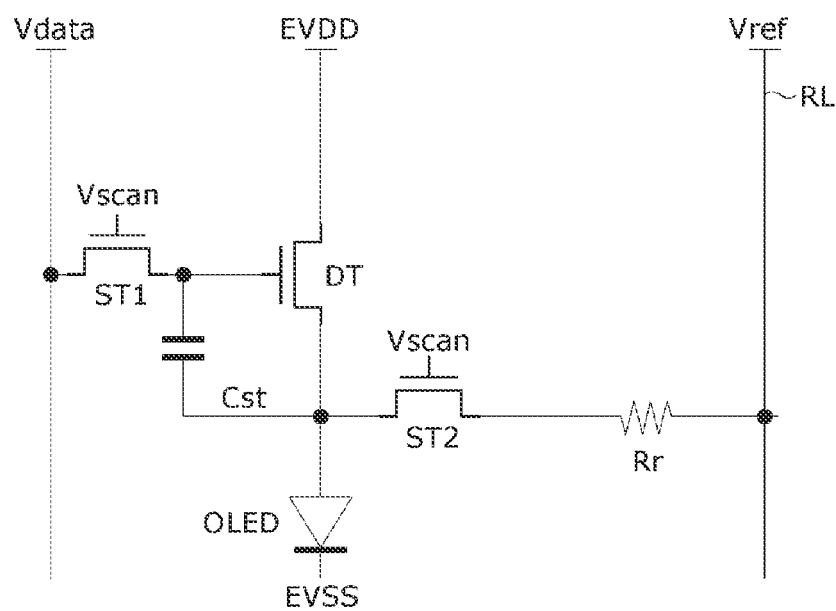

A reference voltage line RL can be implemented using a metalized semiconductor pattern. In this case, as shown in FIG. 20, since a first semiconductor pattern SEM1 and the reference voltage line RL are connected so as to be coplanar with each other, a contact hole is not required. The reference voltage line RL is connected to a second switch element ST2 of a pixel circuit. When the reference voltage line RL and a drain electrode of the second switch element ST2 are connected through a contact hole, as shown in FIG. 21A, resistance Rcnt of the contact hole and line resistance Rr of the reference voltage line RL are present. When the reference voltage line RL and the drain electrode of the second switch element ST2 are directly connected without a contact hole, as shown in FIG. 21B, only line resistance Rr of the reference voltage line RL is present therebetween.

When the reference voltage line RL is implemented using the metalized semiconductor pattern, in order to prevent a short circuit between the reference voltage line and a horizontal power line VDDH, the horizontal power line VDDH can be made of a first metal layer ML1 or a second metal layer ML2 which is separated from a semiconductor layer with an insulating layer interposed therebetween.

In a repair process, when a defective subpixel is darkened, it is necessary to disconnect a node, that is, a line between a driving element DT and an anode AND of a light-emitting element OLED. A wavelength of a laser beam capable of melting an anode can be different from a wavelength of a laser beam capable of melting metal and semiconductor layers. For example, ITO used as an anode can be melted using a laser beam having a wavelength of 266 nm. On the other hand, a semiconductor layer of a branch line can be melted using a laser beam having a wavelength of 1,064 nm. In this case, a laser device for disconnecting the anode and a laser device for disconnecting the branch line are separately required, and a repair process time is increased. In a third embodiment of the present disclosure, in order to disconnect an anode and a branch line at the same time using one laser device in a laser process, the branch line can be implemented in a structure as shown in FIGS. 22 and 23.

Figure 22:
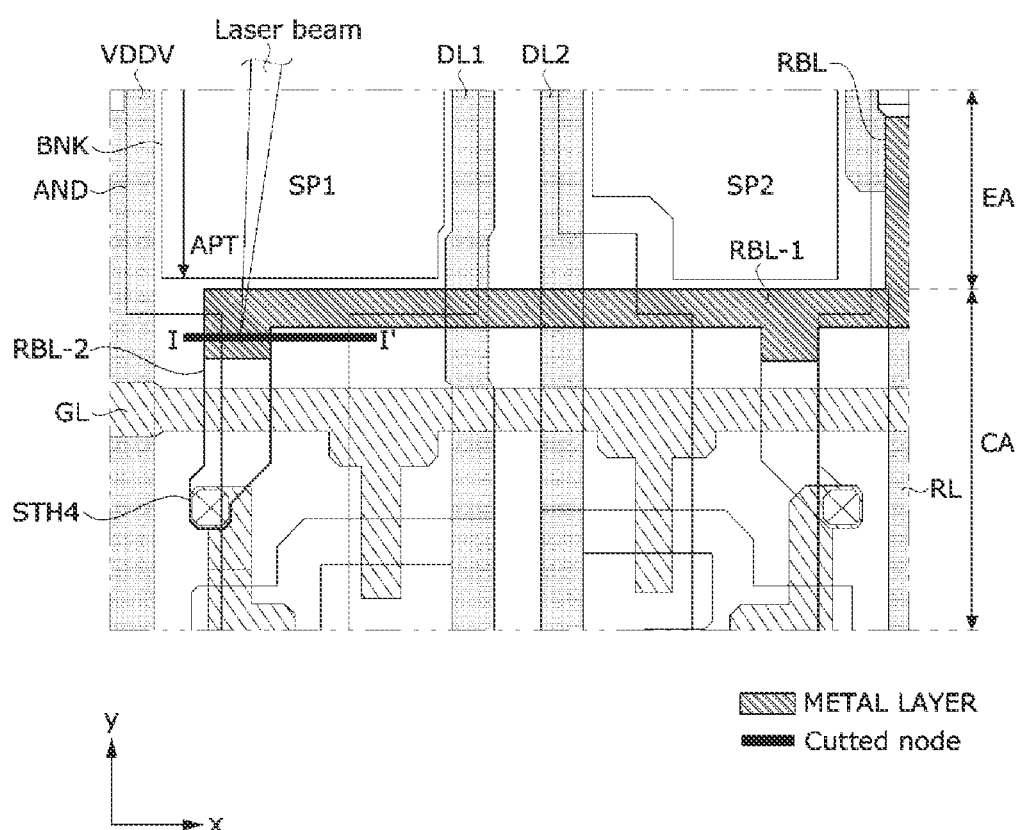
FIG. 22 is an enlarged plan view of a portion of a subpixel darkened in a display panel according to a third embodiment of the present disclosure.

FIG. 22 is a plan view of a display device according to the third embodiment of the present disclosure. FIG. 23 is a cross-sectional view taken along cutting line I-I' in FIG. 22. In the present embodiment, in a repair process, an anode of a light-emitting element OLED and a branch line RBL can be concurrently disconnected using a laser beam having the same wavelength. FIGS. 22 and 23 are enlarged views of a portion of a branch line modified in the pixel circuit of the display panel shown in FIG. 8. In the present embodiment, the same components as in FIG. 8 are denoted by the same reference symbols, and detailed descriptions thereof will be omitted or will be briefly provided.

Figure 23:
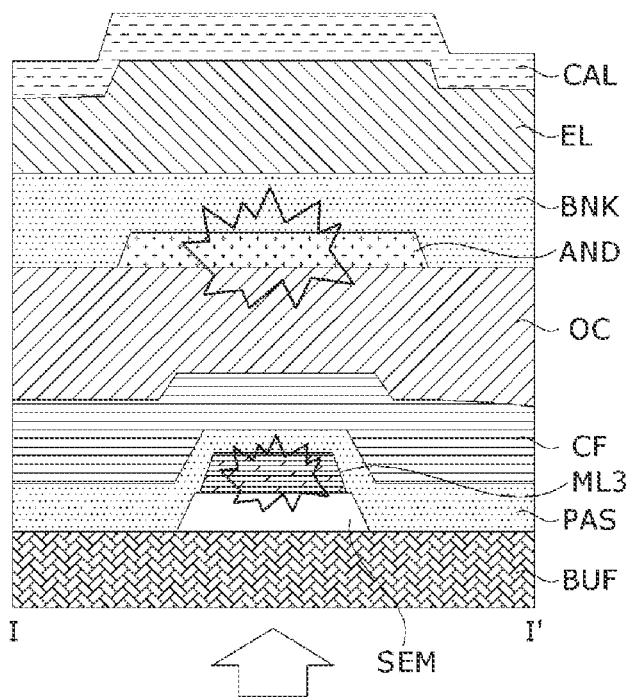
FIG. 23 is a cross-sectional view taken along cutting line I-I' in FIG. 22.

Referring to FIGS. 22 and 23, the branch line RBL includes a long line portion RBL-1 in a first direction x and a branch portion RBL-2 which is bent from the line portion RBL-1 in a second direction y intersecting the first direction x and is connected to a pixel circuit. The line portion RBL-1 is connected to a reference voltage line RL and intersects data lines DL1 and DL2.

The line portion RBL-1 of the branch line RBL has a length that crosses one or more subpixels between emission regions and pixel circuits of the subpixels. At least a portion of the line portion RBL-1 overlaps the anode AND of the light-emitting element OLED between the emission region of the subpixels and a gate line GL. At least a portion of the line portion RBL-1 can overlap a bank BNK.

A plurality of branch portions RBL-2 can be connected to one line portion RBL-1 so that a reference voltage Vref can be applied to one or more subpixels through the branch line RBL. The branch portion RBL-2 includes a non-metalized active layer of a second switch element ST2 and a metalized electrode portion in contact with source and drain electrodes of the second switch element ST2 in a corresponding subpixel. At least a portion of the branch portion RBL-2 overlaps the anode AND of the light-emitting element OLED. At least a portion of the branch portion RBL-2 can overlap the bank BNK.

As shown in FIG. 23, at least a portion of the line portion RBL-1 and at least a portion of the branch portion RBL-2 have a multi-layered structure in which a semiconductor layer SEM and a third metal layer ML3 are stacked. The third metal layer ML3 can be made of any one selected from copper (Cu) and molybdenum titanium (MoTi) or can be a double-metal layer in which copper (Cu) and molybdenum titanium (MoTi) are stacked. Due to the third metal layer ML3 of the line portion RBL-1, the line portion RBL-1 can be disposed in a path that avoids an emission region of an opening. For example, a portion of the line portion RBL-1, in which the third metal layer ML3 is present, can be disposed between the emission regions of the subpixels and the gate line GL.

When a defective subpixel is detected in a display panel 10 having a pixel structure shown in FIGS. 22 and 23, a repair process is performed. In the repair process, in order to darken the defective subpixel, a laser beam is irradiated onto power lines for supplying power (Vref or EVDD) to the pixel circuit. A metal line can be cut using a laser beam having a wavelength of 1,064 nm generated in a general laser device. In the repair process, a laser beam can be irradiated onto a portion of the branch line RBL, in which the third metal layer ML3 and the anode AND overlap each other, for example, along line I-I' in FIGS. 22 and 23 once without changing a wavelength of the laser beam, thereby disconnecting the branch line RBL. In this case, the semiconductor layer SEM below the third metal layer ML3 is not disconnected, but the semiconductor layer SEM is in a state of not being metalized, and thus, there is a disconnection effect.

The repair process can further include disconnecting a horizontal power line VDDH and a gate electrode of a first switch element ST1 using the laser beam.

Figure 24:
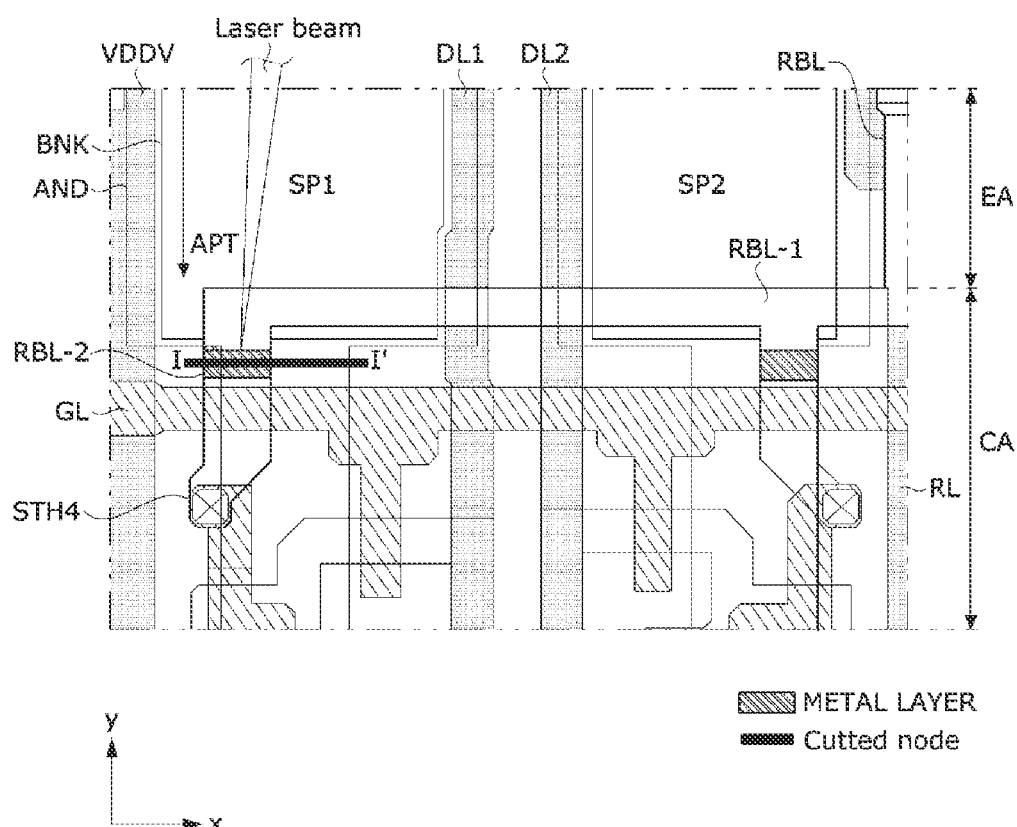
FIG. 24 is an enlarged plan view of a portion of a subpixel darkened in a display panel according to a fourth embodiment of the present disclosure.

As shown in FIG. 24, at least portions of a line portion RBL-1 and a branch portion RBL-2 of a branch line RBL can be implemented in a single-layered structure including a metalized semiconductor layer. For example, at least a portion of the branch portion RBL-2 can have a multi-layered structure in which a semiconductor layer SEM and a third metal layer ML3 are stacked. Since the metalized semiconductor layer is transparent, the metalized semiconductor layer can overlap an emission region of a subpixel so that an opening including the emission region can be enlarged. In the repair process, as shown in FIGS. 23 and 24, a laser beam can be irradiated onto a position of the line portion RBL-1 or the branch portion RBL-2, at which an anode AND and the third metal layer ML3 of the branch line RBL overlap each other, thereby concurrently disconnecting the anode AND and the branch line RBL connected to a defective subpixel.

According to the present disclosure, a portion, which crosses emission regions of subpixels in a branch line for supplying a reference voltage to pixel circuits, is formed of a transparent semiconductor layer, thereby expanding the emission regions of the pixels and increasing an aperture ratio.

According to the present disclosure, a capacity of a storage capacitor of a pixel circuit is increased using a double-capacitor structure, thereby reducing an area occupied by the pixel circuit to expand an emission region and further increase an aperture ratio.

According to the present disclosure, electrodes of a transistor are connected to a metalized semiconductor layer in a contact hole or a metal layer formed on the semiconductor layer, thereby reducing resistance of the contact hole to reduce the size of the contact hole. Furthermore, the number of the contact holes is reduced to reduce an area occupied by a pixel circuit, thereby expanding an emission region and further increasing an aperture ratio.

In a repair method of the present disclosure, in a display panel in which at least a portion of a branch line overlaps an emission region of a subpixel and thus the emission region and an opening of the subpixel are enlarged, a laser beam is irradiated onto a portion, in which an anode of a light-emitting element and a metal layer of the branch line overlap each other, once without changing a wavelength thereof, thereby concurrently disconnecting the anode and the branch line connected to a defective subpixel.

The effects and advantages of the present disclosure are not limited to the effects mentioned above, and other effects can be clearly understood from the description of the claims by those skilled in the art.

The objects to be achieved by the present disclosure, the means for achieving the objects, and effects of the present disclosure described above do not specify essential features of the claims, and, thus, the scope of the claims is not limited to the embodiments of the present disclosure.

Although the embodiments of the present disclosure have been described in more detail with reference to the accompanying drawings, the present disclosure is not limited thereto and can be embodied in many different forms without departing from the technical concept of the present disclosure. Therefore, the embodiments disclosed in the present disclosure are provided for illustrative purposes only and are not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display panel comprising:
   a substrate;
   a light-emitting element including an emission region on the substrate;
   a reference voltage line adjacent to the light-emitting element; and
   a branch line connected to the reference voltage line to apply a reference voltage from the reference voltage line to the light-emitting element via a switching element,
   wherein the light-emitting element emits light to the substrate,
   wherein the branch line includes a semiconductor layer, and wherein the semiconductor layer of the branch line overlaps the emission region.

2. The display panel of claim 1, further comprising a bank disposed on an anode of the light-emitting element,
wherein the bank exposes a portion of the anode and defines an opening including the emission region, and
at least a portion of the semiconductor layer of the branch line overlaps the anode in the opening.

3. The display panel of claim 1, further comprising:
a pixel circuit configured to drive the light-emitting element;
a power line configured to apply a pixel driving voltage to the pixel circuit;
a data line configured to supply a data voltage to the pixel circuit; and
a gate line configured to supply a gate voltage to the pixel circuit.

4. The display panel of claim 3, wherein the power line includes:
a first power line connected to the pixel circuit in a first direction to apply the pixel driving voltage to the pixel circuit; and
a second power line arranged in a second direction intersecting the first direction, and connected to the first power line,
wherein at least a portion of the first power line has a multi-layered structure in which a semiconductor layer and a metal layer are stacked.

5. The display panel of claim 1, wherein the branch line is arranged on a layer different from the reference voltage line and is connected to the reference voltage line through a contact hole.

6. The display panel of claim 5, wherein the branch line includes:
a single-layered branch line including the semiconductor layer; and
a multi-layered branch line including the semiconductor layer and a metal layer stacked on a portion of the semiconductor layer.

7. The display panel of claim 6, wherein the multi-layered branch line is arranged to cross over the data line, and the single-layered branch line is arranged to cross over the emission region.

8. The display panel of claim 3, wherein the branch line includes:
a line portion arranged along a first direction to cross over the emission region; and
at least a branch portion bent from the line portion in a second direction intersecting the first direction to be connected to the pixel circuit.

9. The display panel of claim 1, wherein the branch line and the reference voltage line are arranged to be connected to each other on a same layer.

10. The display panel of claim 9, wherein the reference voltage line includes the semiconductor layer.

11. A display panel comprising:
a substrate;
a transparent anode on the substrate;
a reference voltage line adjacent to the transparent anode; and
a branch line connected to the reference voltage line to apply a reference voltage from the reference voltage line to the transparent anode via a switching element,
wherein the branch line includes a semiconductor layer, and
wherein the semiconductor layer of the branch line overlaps the transparent anode.

12. The display panel of claim 11, further comprising a bank disposed on the transparent anode,
wherein the bank exposes a portion of the transparent anode and defines an opening including an emission region, and
at least a portion of the semiconductor layer of the branch line overlaps the transparent anode in the opening.

13. The display panel of claim 12, further comprising:
a pixel circuit configured to drive a light-emitting element including the transparent anode;
a power line configured to apply a pixel driving voltage to the pixel circuit;
a data line configured to supply a data voltage to the pixel circuit; and
a gate line configured to supply a gate voltage to the pixel circuit.

14. The display panel of claim 13, wherein the branch line includes:
a line portion arranged along a first direction to cross over the transparent anode; and
at least a branch portion bent from the line portion in a second direction intersecting the first direction to be connected to the pixel circuit.

15. The display panel of claim 14, wherein at least a portion of the line portion overlaps the transparent anode between the emission region and the gate line.

16. The display panel of claim 14, wherein at least a portion of the branch portion overlaps the transparent anode.

17. The display panel of claim 14, wherein at least a portion of the branch portion overlaps the bank.

18. The display panel of claim 14, wherein at least a portion of the line portion has a multi-layered structure including he semiconductor layer and a metal layer stacked on the semiconductor layer.

19. The display panel of claim 14, wherein at least a portion of the branch portion includes a multi-layered structure including the semiconductor layer and a metal layer stacked on the semiconductor layer.

20. The display panel of claim 14, wherein at least a portion of the line portion and at least a portion of the branch portion have a single-layered structure including the semiconductor layer.

* * * * *